(12) United States Patent
Sinclair

(10) Patent No.: US 7,984,084 B2
(45) Date of Patent: Jul. 19, 2011

(54) NON-VOLATILE MEMORY WITH SCHEDULED RECLAIM OPERATIONS

(75) Inventor: Alan Welsh Sinclair, Maddiston (GB)

(73) Assignee: SanDisk Technologies, Inc., Plano, TX (US)

( * ) Notice: Subject to any disclaimer, the term of this patent is extended or adjusted under 35 U.S.C. 154(b) by 1201 days.

(21) Appl. No.: 11/259,439

(22) Filed: Oct. 25, 2005

(65) Prior Publication Data

US 2007/0033325 A1  Feb. 8, 2007

Related U.S. Application Data

(60) Provisional application No. 60/705,388, filed on Aug. 3, 2005.

(51) Int. Cl.
*G06F 7/00* (2006.01)
*G06F 17/30* (2006.01)
(52) U.S. Cl. ...................................................... 707/818
(58) Field of Classification Search .................. 707/206, 707/818; 711/170
See application file for complete search history.

(56) References Cited

U.S. PATENT DOCUMENTS

| | | | |
|---|---|---|---|
| 4,864,511 A | 9/1989 | Moy et al. | |
| 5,479,633 A | 12/1995 | Wells et al. | |
| 5,553,261 A | 9/1996 | Hasbun et al. | |
| 5,570,315 A | 10/1996 | Tanaka et al. | 365/185.22 |
| 5,602,987 A | 2/1997 | Harari et al. | 714/8 |
| 5,640,529 A | 6/1997 | Hasbun | |
| 5,774,397 A | 6/1998 | Endoh et al. | 365/185.19 |
| 5,875,477 A | 2/1999 | Hasbun et al. | 711/162 |
| 5,896,393 A * | 4/1999 | Yard et al. | 714/710 |
| 6,029,168 A * | 2/2000 | Frey | 707/10 |
| 6,038,571 A * | 3/2000 | Numajiri et al. | 707/206 |
| 6,046,935 A | 4/2000 | Takeuchi et al. | 365/185.03 |
| 6,151,666 A * | 11/2000 | Blendermann et al. | 711/170 |
| 6,373,746 B1 | 4/2002 | Takeuchi et al. | 365/185.03 |
| 6,426,893 B1 | 7/2002 | Conley et al. | 365/185.11 |
| 6,449,625 B1 * | 9/2002 | Wang | 707/206 |
| 6,456,528 B1 | 9/2002 | Chen | 365/185.03 |
| 6,522,580 B2 | 2/2003 | Chen et al. | 365/185.02 |
| 6,526,421 B1 * | 2/2003 | Houldsworth | 707/206 |
| 6,571,326 B2 | 5/2003 | Spiegel et al. | |
| 6,604,168 B2 | 8/2003 | Ogawa | |

(Continued)

FOREIGN PATENT DOCUMENTS

WO   WO 00/60469   10/2000

(Continued)

OTHER PUBLICATIONS

U.S. Appl. No. 10/917,888, filed Aug. 13, 2005, 171 pages.

(Continued)

*Primary Examiner* — Greta L Robinson
*Assistant Examiner* — Jeffrey Chang
(74) *Attorney, Agent, or Firm* — Weaver Austin Villeneuve & Sampson LLP

(57) ABSTRACT

In a non-volatile memory array, scheduling of reclaim operations to occur before a shortage of erased blocks arises avoids extended periods of reclaim that could exceed a time limit. A memory controller uses information regarding the data stored in the memory array to estimate the additional host data that may be programmed and the reclaim operations to be performed and schedules the reclaim operations to be evenly distributed between write operations until the memory is full.

7 Claims, 14 Drawing Sheets

U.S. PATENT DOCUMENTS

| | | | |
|---|---|---|---|
| 6,622,200 B1 | 9/2003 | Hasbun et al. | |
| 6,715,027 B2 | 3/2004 | Kim et al. | 711/103 |
| 6,725,322 B1 * | 4/2004 | Shiraishi et al. | 711/103 |
| 6,763,424 B2 | 7/2004 | Conley | 711/103 |
| 6,771,536 B2 | 8/2004 | Li et al. | 365/185.02 |
| 6,781,877 B2 | 8/2004 | Cernea et al. | 365/185.03 |
| 6,865,122 B2 * | 3/2005 | Srinivasan | 365/200 |
| 7,287,145 B1 * | 10/2007 | Simeral et al. | 711/202 |
| 7,409,489 B2 | 8/2008 | Sinclair et al. | |
| 2003/0109093 A1 | 6/2003 | Harari et al. | 438/200 |
| 2003/0147278 A1 | 8/2003 | Tanaka et al. | 365/185.03 |
| 2004/0073748 A1 | 4/2004 | Rudelic | 711/118 |
| 2004/0248612 A1 | 12/2004 | Lee et al. | 455/550.1 |
| 2005/0141312 A1 | 6/2005 | Sinclair et al. | 711/103 |
| 2005/0144357 A1 | 6/2005 | Sinclair | 711/103 |
| 2005/0144358 A1 | 6/2005 | Conley et al. | 711/218 |
| 2005/0144360 A1 | 6/2005 | Bennett et al. | |
| 2005/0144363 A1 | 6/2005 | Sinclair | 711/159 |
| 2005/0144365 A1 | 6/2005 | Gorobets et al. | 711/103 |
| 2005/0144367 A1 | 6/2005 | Sinclair | 711/133 |
| 2005/0149686 A1 | 7/2005 | Bacon et al. | 711/170 |
| 2005/0166005 A1 | 7/2005 | Nagano et al. | 711/103 |
| 2005/0166087 A1 | 7/2005 | Gorobets | 711/173 |
| 2006/0020744 A1 | 1/2006 | Sinclair et al. | 711/170 |
| 2006/0020745 A1 | 1/2006 | Conley et al. | 711/170 |
| 2006/0031593 A1 | 2/2006 | Sinclair | 709/251 |
| 2006/0184718 A1 | 8/2006 | Sinclair et al. | 711/103 |
| 2006/0184719 A1 | 8/2006 | Sinclair | 711/203 |
| 2007/0033324 A1 | 2/2007 | Sinclair | 711/103 |

FOREIGN PATENT DOCUMENTS

| | | |
|---|---|---|
| WO | WO 2007/019198 | 2/2007 |

OTHER PUBLICATIONS

U.S. Appl. No. 11/060,249, filed Feb. 16, 2005, 117 pages.

U.S. Appl. No. 11/040,325, filed Jan. 20, 2005, 47 pages.

ISA/EPO; "Notification of Transmittal of the International Search Report and the Written Opinion of the International Searching Authority, or the Declaration"; European Patent Office; mailed on Mar. 4, 2007; in corresponding Int'l. Application No. PCT/US2006/030166; 9 pages.

USPTO, Office Action mailed in related U.S. Appl. No. 11/259,423 on Oct. 4, 2007, 11 pages.

Chang et al., Real-Time Garbage Collection for Flash-Memory Storage Systems of Real-Time Embedded Systems, ACM Press, vol. 3, pp. 838-863.

USPTO, "Notice of Allowance and Fee(s) Due" mailed in related U.S. Appl. No. 11/259,423 on Apr. 2, 2008, 22 pages.

Chinese Office Action mailed Jan. 8, 2010 in Application No. 200680036085.2.

Korean Office Action mailed Jan. 26, 2010 in Application No. 2008-7005059.

Chinese Office Action mailed May 12, 2010 in Application No. 200680036085.2.

* cited by examiner

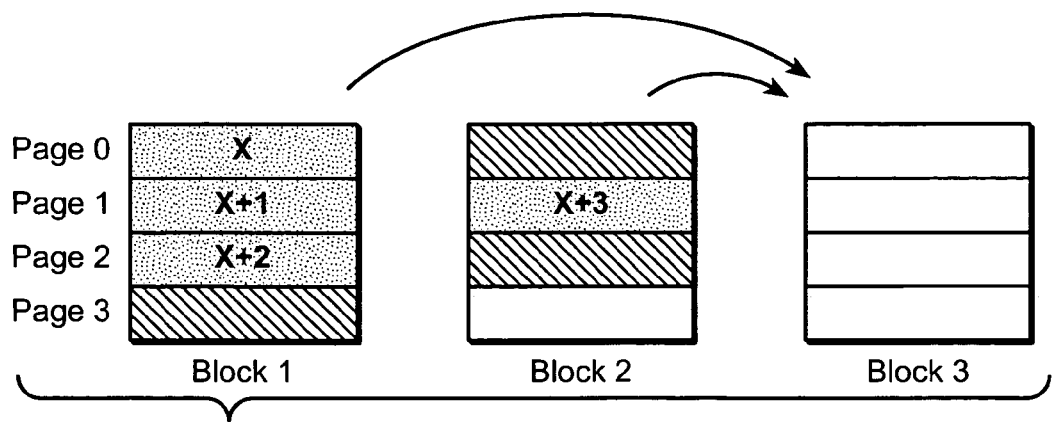
FIG. 8A  Before Garbage Collection
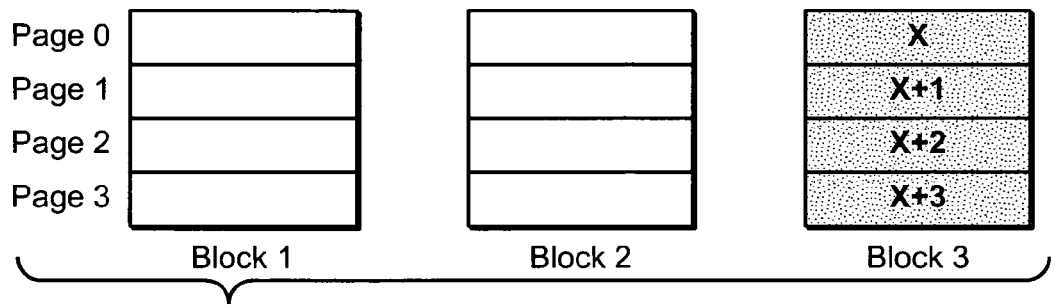
FIG. 8B  After Garbage Collection
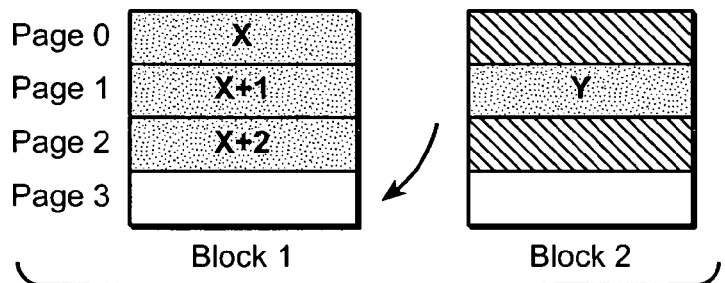
FIG. 9A  Before Garbage Collection
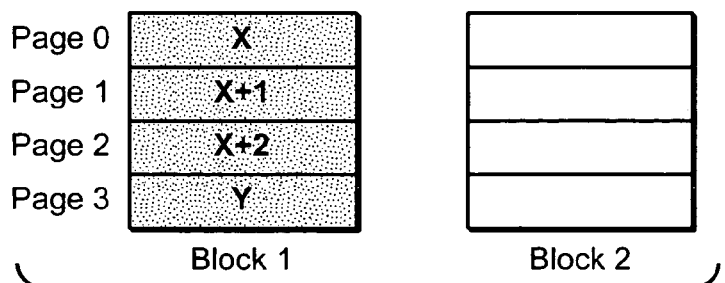
FIG. 9B  After Garbage Collection

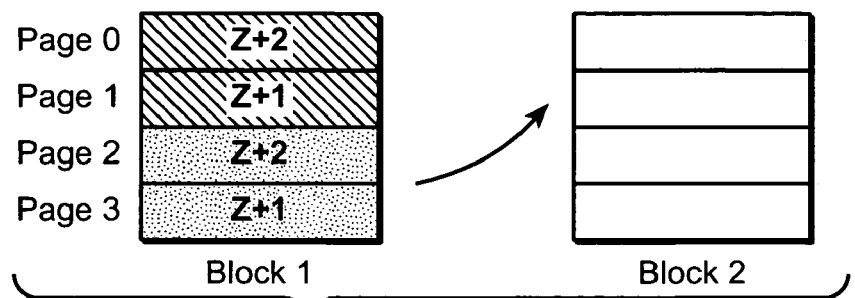
*FIG. 10A* Before Compaction
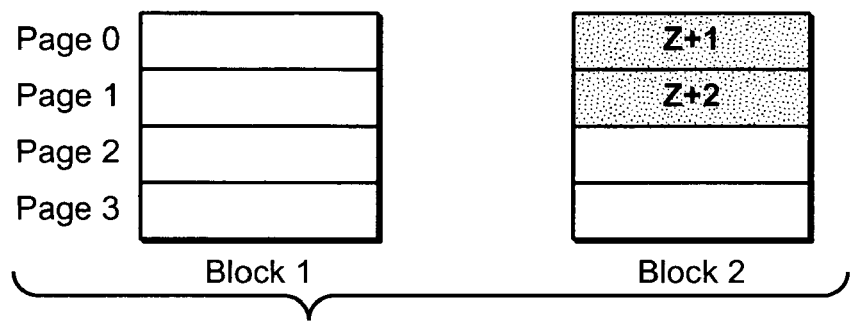
*FIG. 10B* After Compaction
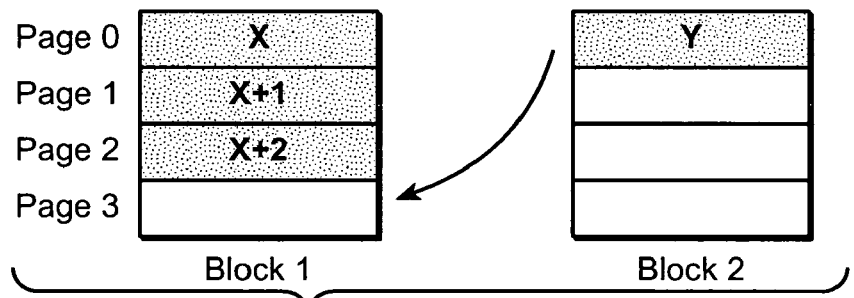
*FIG. 11A* Before Consolidation
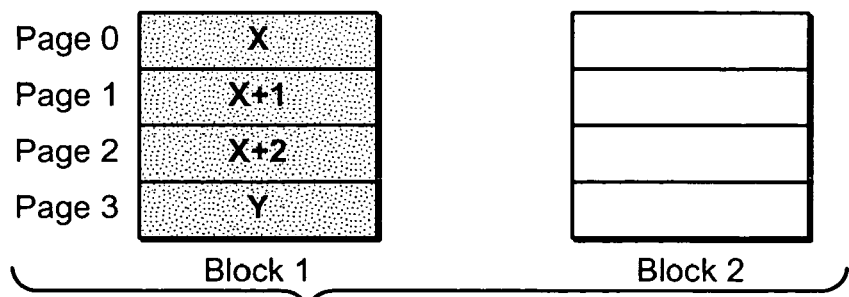
*FIG. 11B* After Consolidation

NON-VOLATILE MEMORY WITH SCHEDULED RECLAIM OPERATIONS

CROSS-REFERENCE TO RELATED APPLICATIONS

This application claims the benefit of U.S. Provisional Application No. 60/705,388, entitled "Direct Data File Storage in Flash Memories" filed on Aug. 3, 2005. This application is related to U.S. patent application Ser. No. 11/259,423, entitled, "Scheduling of Reclaim Operations in Non-Volatile Memory," filed on the same day as the present application, and hereby incorporated by reference in its entirety.

BACKGROUND

This application relates to the operation of re-programmable non-volatile memory systems such as semiconductor flash memory, and, more specifically, to the management of available space within such memories. All patents, patent applications, articles and other publications, documents and things referenced herein are hereby incorporated herein by this reference in their entirety for all purposes.

In an early generation of commercial flash memory systems, a rectangular array of memory cells was divided into a large number of groups of cells that each stored the amount of data of a standard disk drive sector, namely 512 bytes. An additional amount of data, such as 16 bytes, are also usually included in each group to store an error correction code (ECC) and possibly other overhead data relating to the user data and/or to the memory cell group in which it is stored. The memory cells in each such group are the minimum number of memory cells that are erasable together. That is, in such memory systems, the erase unit is effectively the number of memory cells that store one data sector and any overhead data that is included. Examples of this type of memory system are described in U.S. Pat. Nos. 5,602,987 and 6,426,893. It is a characteristic of flash memory that the memory cells need to be erased prior to re-programming them with data.

Flash memory systems are most commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In later generations of flash memory systems, the size of the erase unit was increased to a block of enough memory cells to store multiple sectors of data. Even though host systems with which the memory systems are connected may program and read data in small minimum units such as sectors, a large number of sectors are stored in a single erase unit of the flash memory. It is common for some sectors of data within a block to become obsolete as the host updates or replaces logical sectors of data. Since the entire block must be erased before any data stored in the block can be overwritten, new or updated data are typically stored in another block that has been erased and has remaining capacity for the data. This process leaves the original block with obsolete data that take valuable space within the memory. But that block cannot be erased if there are any valid data remaining in it.

Therefore, in order to better utilize the memory's storage capacity, it is common to consolidate or collect valid partial block amounts of data by copying them into an erased block so that the block(s) from which these data are copied may then be erased and their entire storage capacity reused. In this way, space within a memory that does not contain valid data may be reclaimed so that it can be used for storing data. It is also desirable to copy the data in order to group data sectors within a block in the order of their logical addresses since this increases the speed of reading the data and transferring the read data to the host. If such data copying occurs too frequently, the operating performance of the memory system can be degraded. This particularly affects operation of memory systems where the storage capacity of the memory is little more than the amount of data addressable by the host through the logical address space of the system, a typical case. In this case, data consolidation or collection may be required before a host programming command can be executed. The programming time is then increased.

The sizes of blocks are increasing in successive generations of memory systems in order to increase the number of bits of data that may be stored in a given semiconductor area. Blocks storing 256 data sectors and more are becoming common. Additionally, two, four or more blocks of different arrays or sub-arrays are often logically linked together into metablocks in order to increase the degree of parallelism in data programming and reading. Along with such large capacity operating units come challenges in operating them efficiently.

Therefore, there is a need for improved management of data stored in a non-volatile memory. There is also a need for a system of efficiently reclaiming memory space that does not contain valid data but is not currently available for storage of new valid data. There is also a need for a system of carrying out reclaim operations in a way that has little or no adverse effect on other memory operations such as the programming of host data.

SUMMARY

Reclaiming space in a memory array before the memory runs out of erased blocks may avoid the risk of serious delay in programming host data that might exceed a time limit. Space in the memory array is reclaimed as the memory fills with host data in a manner that ensures that the memory does not run out of erased blocks until it is full. Reclaim may be performed according to a schedule that begins reclaim long before there is a shortage of erased blocks. The reclaim operations are interleaved with writing of host data according to an interleave ratio so that reclaim operations are spread out over an extended period instead of being done in a long continuous burst. The interleave ratio is calculated to be the ratio of all remaining host writes to all remaining reclaim writes.

Where a file-based host interface connects the memory to a host, the memory controller may have accurate, up-to-date information regarding the data stored in the memory array and can estimate the appropriate interleave ratio from the amount of additional host data that can be written to the memory before it is full and the amount of reclaim needed before the memory is full. By spreading the reclaim operations evenly throughout the remaining time, a constant rate of programming of host data is achieved. In memories having sector-based or other interfaces, information may be provided by the host to allow such estimates to be made so that an interleave ratio may be similarly calculated.

An interleave ratio may be calculated at intervals or when there is a triggering event such as the deletion of some stored data by a host. Thus, the interleave ratio is updated as appropriate so that the ratio is adaptive to changing circumstances.

Reclaim may be differently managed in different modes. In addition to the adaptive reclaim based on estimates of host data to be written and reclaim operations to be done, there may be a minimum reclaim mode in which space is reclaimed at some low (or zero) rate. Typically, the minimum reclaim mode applies where there are adequate erased blocks compared to reclaimable space. There may also be a maximum reclaim mode in which space is reclaimed in an interleaved manner at some maximum rate. Typically, the maximum reclaim mode applies where there are few erased blocks, a situation that generally occurs when the memory is nearly full. In addition, reclaim may be done in a continuous manner (not interleaved) in response to a host command. Reclaim may also be inhibited in response to a host command.

BRIEF DESCRIPTION OF THE DRAWINGS

FIGS. 8A and 8B show an example of garbage collection in a non-volatile memory.

FIGS. 9A and 9B show another example of garbage collection in a non-volatile memory.

FIGS. 10A and 10B show an example of compaction in a non-volatile memory.

FIGS. 11A and 11B show an example of consolidation in a non-volatile memory.

DETAILED DESCRIPTION

A current flash memory system and a typical operation with host devices are described with respect to FIGS. 1-8. It is in such a system that the various aspects of the present invention may be implemented. A host system 1 of FIG. 1 stores data into and retrieves data from a flash memory 2. Although the flash memory can be embedded within the host, the memory 2 is illustrated to be in the more popular form of a card that is removably connected to the host through mating parts 3 and 4 of a mechanical and electrical connector. There are currently many different flash memory cards that are commercially available, examples being the Compact Flash (CF), the Multimedia Card (MMC), Secure Digital (SD), miniSD, Memory Stick, Smart Media and TransFlash cards. Although each of these cards has a unique mechanical and/or electrical interface according to its standardized specifications, the flash memory included in each is very similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that use such memory cards and flash drives are many and varied. They include personal computers (PCs), laptop and other portable computers, cellular telephones, personal digital assistants (PDAs), digital still cameras, digital movie cameras and portable audio players. The host typically includes a built-in receptacle for one or more types of memory cards or flash drives but some require adapters into which a memory card is plugged.

Figure 1:
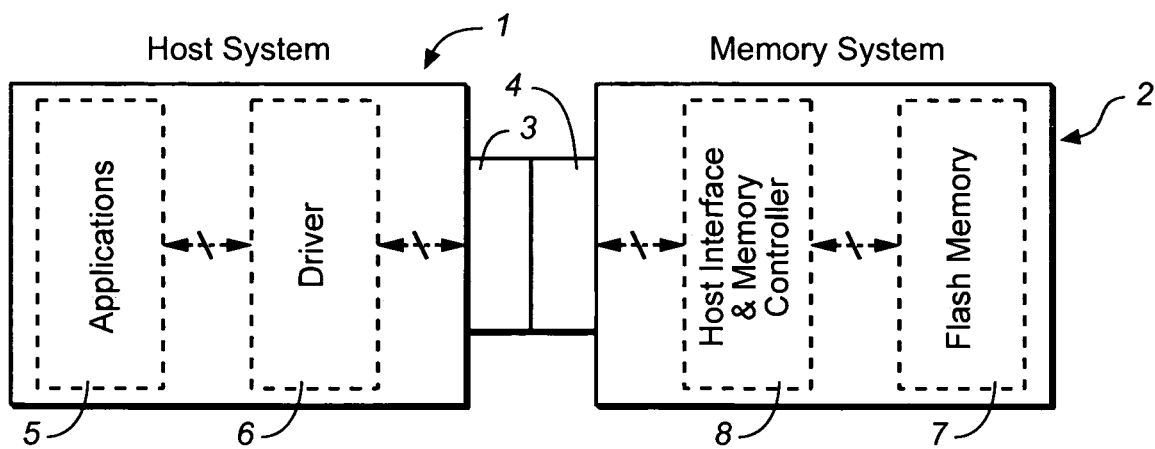
FIG. 1 schematically illustrates a host and a connected non-volatile memory system as currently implemented.

The host system 1 of FIG. 1 may be viewed as having two major parts, insofar as the memory 2 is concerned, made up of a combination of circuitry and software. They are an applications portion 5 and a driver portion 6 that interfaces with the memory 2. In a personal computer, for example, the applications portion 5 can include a processor running word processing, graphics, control or other popular application software. In a camera, cellular telephone or other host system that is primarily dedicated to performing a single set of functions, the applications portion 5 includes the software that operates the camera to take and store pictures, the cellular telephone to make and receive calls, and the like.

The memory system 2 of FIG. 1 includes flash memory 7, and circuits 8 that both interface with the host to which the card is connected for passing data back and forth and control the memory 7. The controller 8 typically converts between logical addresses of data used by the host 1 and physical addresses of the memory 7 during data programming and reading.

Figure 2:
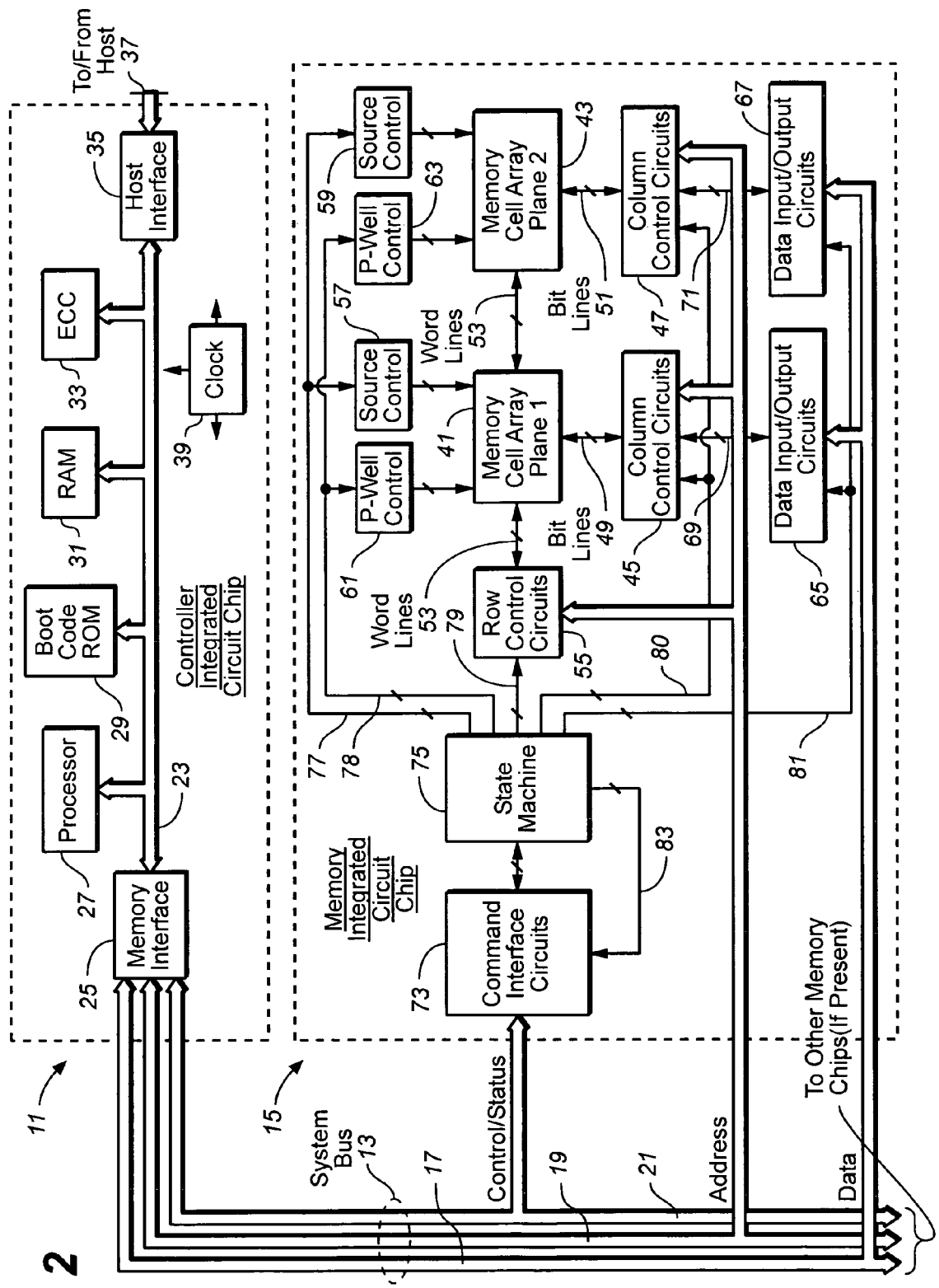
FIG. 2 is a block diagram of an example flash memory system for use as the non-volatile memory of FIG. 1.

Referring to FIG. 2, circuitry of a typical flash memory system that may be used as the non-volatile memory 2 of FIG. 1 is described. The system controller is usually implemented on a single integrated circuit chip 11 that is connected in parallel with one or more integrated circuit memory chips over a system bus 13, a single such memory chip 15 being shown in FIG. 2. The particular bus 13 that is illustrated includes a separate set of conductors 17 to carry data, a set 19 for memory addresses and a set 21 for control and status signals. Alternatively, a single set of conductors may be time shared between these three functions. Further, other configurations of system buses can be employed, such as a ring bus that is described in U.S. patent application Ser. No. 10/915, 039, filed Aug. 9, 2004, entitled "Ring Bus Structure and Its Use in Flash Memory Systems."

A typical controller chip 11 has its own internal bus 23 that interfaces with the system bus 13 through interface circuits 25. The primary functions normally connected to the bus are a processor 27 (such as a microprocessor or micro-controller), a read-only-memory (ROM) 29 containing code to initialize ("boot") the system, read-only-memory (RAM) 31 used primarily to buffer data being transferred between the memory and a host, and circuits 33 that calculate and check an error correction code (ECC) for data passing through the controller between the memory and the host. The controller bus 23 interfaces with a host system through circuits 35, which, in the case of the system of FIG. 2 being contained within a memory card, is done through external contacts 37 of the card that are part of the connector 4. A clock 39 is connected with and utilized by each of the other components of the controller 11.

The memory chip 15, as well as any other connected with the system bus 13, typically contains an array of memory cells organized into multiple sub-arrays or planes, two such planes 41 and 43 being illustrated for simplicity but more, such as four or eight such planes, may instead be used. Alternatively, the memory cell array of the chip 15 may not be divided into planes. When so divided however, each plane has its own column control circuits 45 and 47 that are operable independently of each other. The circuits 45 and 47 receive addresses of their respective memory cell array from the address portion 19 of the system bus 13, and decode them to address a specific one or more of respective bit lines 49 and 51. The word lines 53 are addressed through row control circuits 55 in response to addresses received on the address bus 19. Source voltage control circuits 57 and 59 are also connected with the respective planes, as are p-well voltage control circuits 61 and 63. If the memory chip 15 has a single array of memory cells, and if two or more such chips exist in the system, the array of each chip may be operated similarly to a plane or sub-array within the multi-plane chip described above.

Data are transferred into and out of the planes 41 and 43 through respective data input/output circuits 65 and 67 that are connected with the data portion 17 of the system bus 13. The circuits 65 and 67 provide for both programming data into the memory cells and for reading data from the memory cells of their respective planes, through lines 69 and 71 connected to the planes through respective column control circuits 45 and 47.

Although the controller 11 controls the operation of the memory chip 15 to program data, read data, erase and attend to various housekeeping matters, each memory chip also contains some controlling circuitry that executes commands from the controller 11 to perform such functions. Interface circuits 73 are connected to the control and status portion 21 of the system bus 13. Commands from the controller are provided to a state machine 75 that then provides specific control of other circuits in order to execute these commands. Control lines 77-81 connect the state machine 75 with these other circuits as shown in FIG. 2. Status information from the state machine 75 is communicated over lines 83 to the interface 73 for transmission to the controller 11 over the bus portion 21.

A NAND architecture of the memory cell arrays 41 and 43 is currently common, although other architectures, such as NOR, can also be used instead. Examples of NAND flash memories and their operation as part of a memory system may be had by reference to U.S. Pat. Nos. 5,570,315, 5,774,397, 6,046,935, 6,373,746, 6,456,528, 6,522,580, 6,771,536 and 6,781,877 and U.S. Patent Application Publication No. 2003/0147278.

Figure 3:
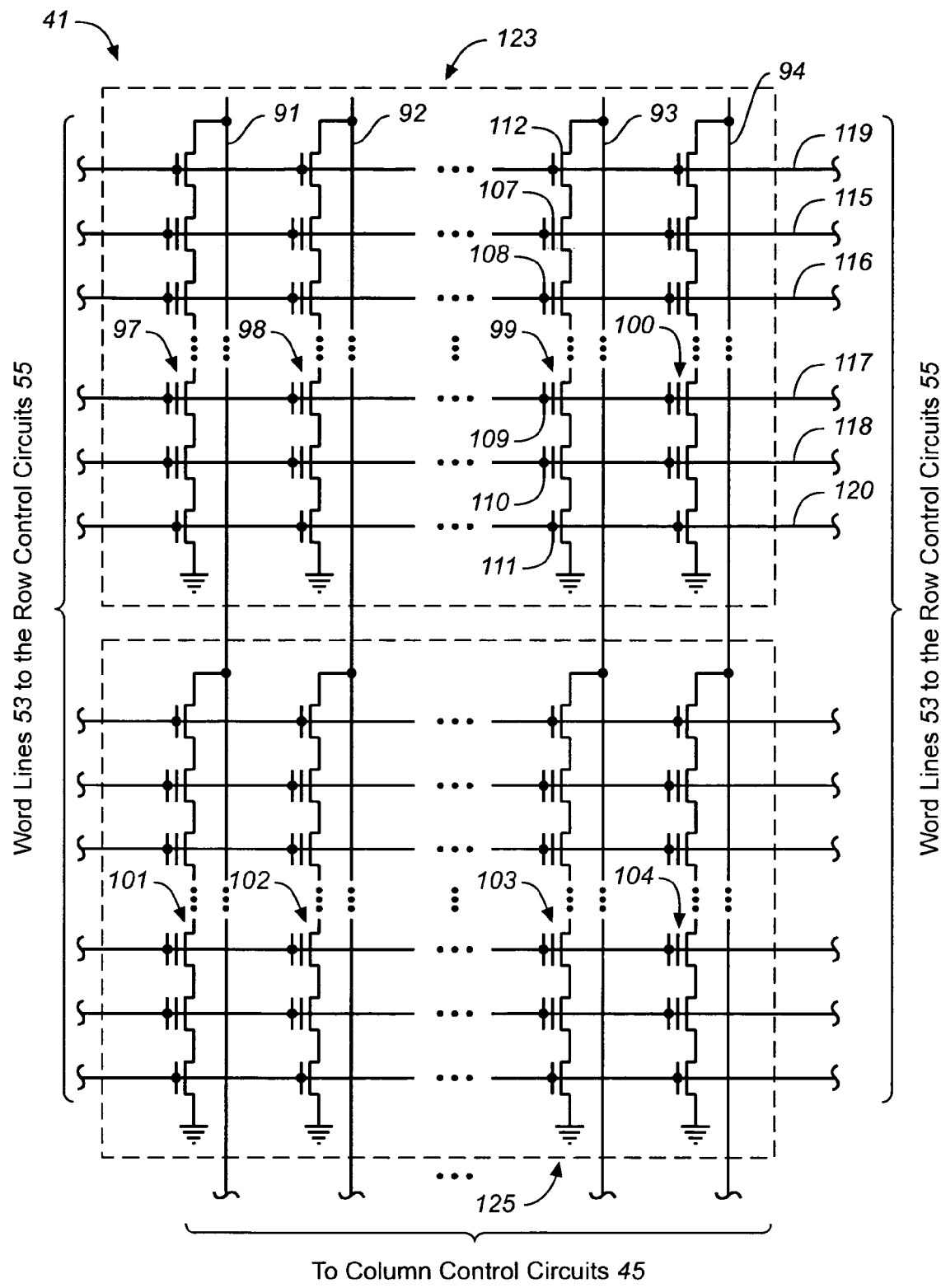
FIG. 3 is a representative circuit diagram of a memory cell array that may be used in the system of FIG. 2.

An example NAND array is illustrated by the circuit diagram of FIG. 3, which is a portion of the memory cell array 41 of the memory system of FIG. 2. A large number of global bit lines are provided, only four such lines 91-94 being shown in FIG. 2 for simplicity of explanation. A number of series connected memory cell strings 97-104 are connected between one of these bit lines and a reference potential. Using the memory cell string 99 as representative, a plurality of charge storage memory cells 107-110 are connected in series with select transistors 111 and 112 at either end of the string. When the select transistors of a string are rendered conductive, the string is connected between its bit line and the reference potential. One memory cell within that string is then programmed or read at a time.

Word lines 115-118 of FIG. 3 individually extend across the charge storage element of one memory cell in each of a number of strings of memory cells, and gates 119 and 120 control the states of the select transistors at each end of the strings. The memory cell strings that share common word and control gate lines 115-120 are made to form a block 123 of memory cells that are erased together. This block of cells contains the minimum number of cells that are physically erasable at one time. One row of memory cells, those along one of the word lines 115-118, are programmed at a time. Typically, the rows of a NAND array are programmed in a prescribed order, in this case beginning with the row along the word line 118 closest to the end of the strings connected to ground or another common potential. The row of memory cells along the word line 117 is programmed next, and so on, throughout the block 123. The row along the word line 115 is programmed last.

A second block 125 is similar, its strings of memory cells being connected to the same global bit lines as the strings in the first block 123 but having a different set of word and control gate lines. The word and control gate lines are driven to their proper operating voltages by the row control circuits 55. If there is more than one plane or sub-array in the system, such as planes 1 and 2 of FIG. 2, one memory architecture uses common word lines extending between them. There can alternatively be more than two planes or sub-arrays that share common word lines. In other memory architectures, the word lines of individual planes or sub-arrays are separately driven.

As described in several of the NAND patents and published application referenced above, the memory system may be operated to store more than two detectable levels of charge in each charge storage element or region, thereby to store more than one bit of data in each. The charge storage elements of the memory cells are most commonly conductive floating gates but may alternatively be non-conductive dielectric charge trapping material, as described in U.S. Patent Application Publication No. 2003/0109093.

Figure 4:
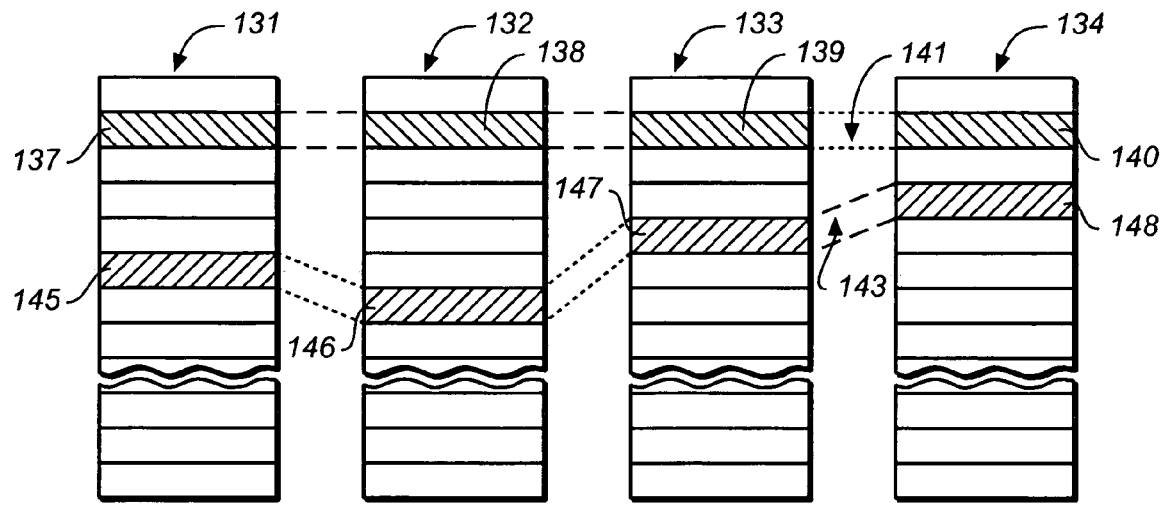
FIG. 4 illustrates an example physical memory organization of the system of FIG. 2.

FIG. 4 conceptually illustrates an organization of the flash memory cell array 7 (FIG. 1) that is used as an example in further descriptions below. Four planes or sub-arrays 131-134 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 4 by rectangles, such as blocks 137, 138, 139 and 140, located in respective planes 131-134. There can be dozens or hundreds of blocks in each plane. As mentioned above, the block of memory cells is the unit of erase, the smallest number of memory cells that are physically erasable together. For increased parallelism, however, the blocks are operated in larger metablock units. One block from each plane is logically linked together to form a metablock. The four blocks 137-140 are shown to form one metablock 141. All of the cells within a metablock are typically erased together. The blocks used to form a metablock need not be restricted to the same relative locations within their respective planes, as is shown in a second metablock 143 made up of blocks 145-148. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 5:
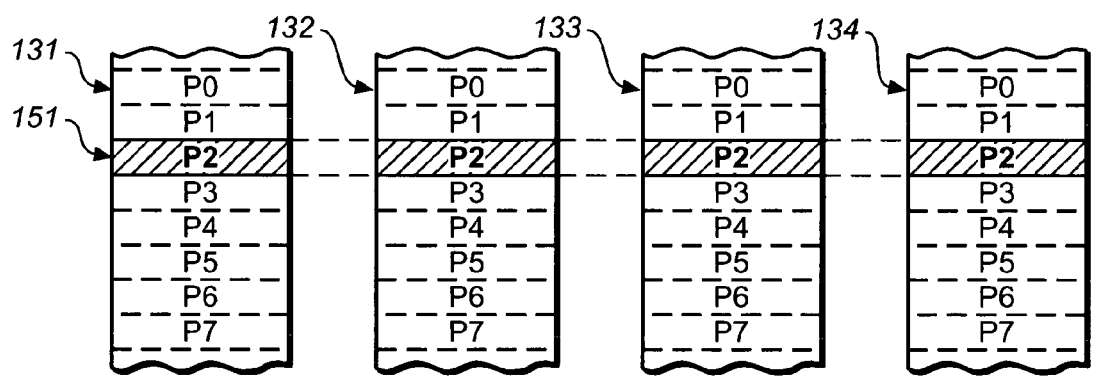
FIG. 5 shows an expanded view of a portion of the physical memory of FIG. 4.

The individual blocks are in turn divided for operational purposes into pages of memory cells, as illustrated in FIG. 5. The memory cells of each of the blocks 131-134, for example, are each divided into eight pages P0-P7. Alternatively, there may be 16, 32 or more pages of memory cells within each block. The page is the unit of data programming and reading within a block, containing the minimum amount of data that are programmed at one time. In the NAND architecture of FIG. 3, a page is formed of memory cells along a word line within a block. However, in order to increase the memory system operational parallelism, such pages within two or more blocks may be logically linked into metapages. A metapage 151 is illustrated in FIG. 5, being formed of one physical page from each of the four blocks 131-134. The metapage 151, for example, includes the page P2 in of each of the four blocks but the pages of a metapage need not necessarily have the same relative position within each of the blocks. Although it is preferable to program and read the maximum amount of data in parallel across all four planes, for high system performance, the memory system can also be operated to form metapages of any or all of one, two or three pages in separate blocks in different planes. This allows the programming and reading operations to adaptively match the amount of data that may be conveniently handled in parallel and reduces the occasions when part of a metapage remains unprogrammed with data.

A metapage formed of physical pages of multiple planes, as illustrated in FIG. 5, contains memory cells along word line rows of those multiple planes. Rather than programming all of the cells in one word line row at the same time, they are more commonly alternately programmed in two or more interleaved groups, each group storing a page of data (in a single block) or a metapage of data (across multiple blocks). By programming alternate memory cells at one time, a unit of peripheral circuits including data registers and a sense amplifier need not be provided for each bit line but rather are time-shared between adjacent bit lines. This economizes on the amount of substrate space required for the peripheral circuits and allows the memory cells to be packed with an increased density along the rows. Otherwise, it is preferable to simultaneously program every cell along a row in order to maximize the parallelism available from a given memory system. For most data management purposes, metablocks and metapages may be treated in the same way as blocks and pages. Examples given in this application in terms of metablocks and metapages are generally also applicable to memories using blocks and pages as the units of erase and programming respectively. Similarly, examples given in terms of blocks and pages are generally also applicable to memories using metablocks and metapages.

One challenge to efficiently controlling operation of memory arrays with very large erase blocks is to match and align the number of data sectors being stored during a given write operation with the capacity and boundaries of blocks of memory. One approach is to configure a metablock used to store new data from the host with less than a maximum number of blocks, as necessary to store a quantity of data less than an amount that fills an entire metablock. The use of adaptive metablocks is described in U.S. patent application Ser. No: 10/749,189, filed Dec. 30, 2003, entitled "Adaptive Metablocks." The fitting of boundaries between blocks of data and physical boundaries between metablocks is described in patent applications Ser. No. 10/841,118, filed May 7, 2004, and Ser. No. 11/016,271, filed Dec. 16, 2004, entitled "Data Run Programming."

With reference to FIG. 3, the simultaneous programming of data into every other memory cell along a row is most conveniently accomplished by providing two rows of select transistors (not shown) along at least one end of the NAND strings, instead of the single row that is shown. The select transistors of one row then connect every other string within a block to their respective bit lines in response to one control signal, and the select transistors of the other row connect intervening every other string to their respective bit lines in response to another control signal. Two pages of data are therefore written into each row of memory cells.

Figure 6:
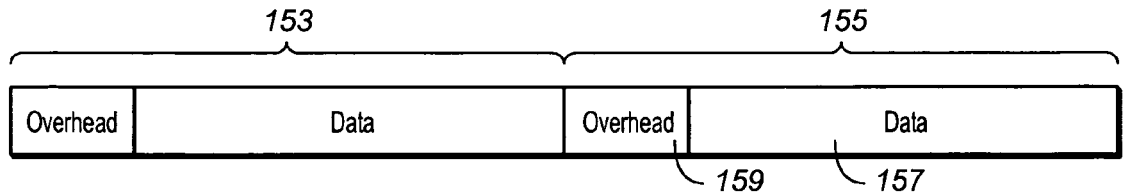
FIG. 6 shows a further expanded view of a portion of the physical memory of FIGS. 4 and 5.

The amount of data in each logical page is typically an integer number of one or more sectors of data, each sector containing 512 bytes of data, by convention. FIG. 6 shows a logical data page of two sectors 153 and 155 of data of a page or metapage. Each sector usually contains a portion 157 of 512 bytes of user or system data being stored and another number of bytes 159 for overhead data related either to the data in the portion 157 or to the physical page or block in which it is stored. The number of bytes of overhead data is typically 16 bytes, making the total 528 bytes for each of the sectors 153 and 155. The overhead portion 159 may contain an ECC calculated from the data portion 157 during programming, its logical address, an experience count of the number of times the block has been erased and re-programmed, one or more control flags, operating voltage levels, and/or the like, plus an ECC calculated from such overhead data 159. Alternatively, the overhead data 159, or a portion of it, may be stored in different pages in other blocks.

As the parallelism of memories increases, data storage capacity of the metablock increases and the size of the data page and metapage also increase as a result. The data page may then contain more than two sectors of data. With two sectors in a data page, and two data pages per metapage, there are four sectors in a metapage. Each metapage thus stores 2048 bytes of data. This is a high degree of parallelism, and can be increased even further as the number of memory cells in the rows is increased. For this reason, the width of flash memories is being extended in order to increase the amount of data in a page and a metapage. The physically small re-programmable non-volatile memory cards and flash drives identified above are commercially available with data storage capacity of 512 megabytes (MB), 1 gigabyte (GB), 2 GB and 4 GB, and may go higher.

Figure 7:
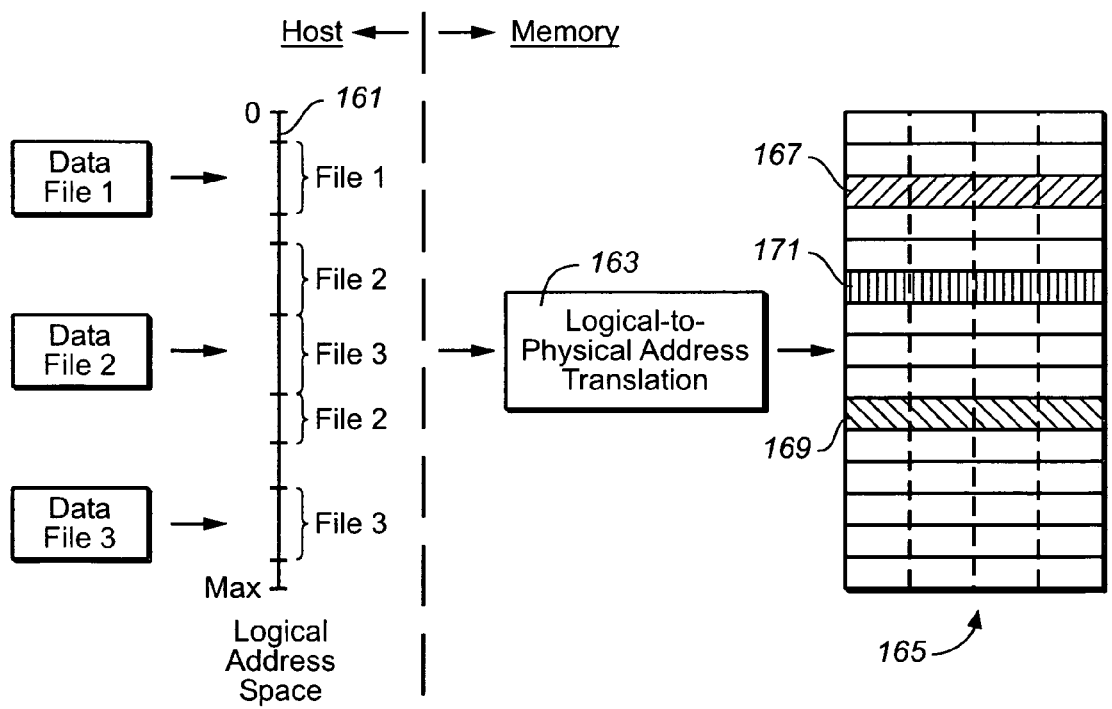
FIG. 7 illustrates a common logical address interface between a host and a re-programmable memory system.

FIG. 7 illustrates a common interface between a host and such a mass memory system. The host deals with data files generated or used by application software or firmware programs executed by the host. A word processing data file is an example, and a drawing file of computer aided design (CAD) software is another, found mainly in general computer hosts such as PCs, laptop computers and the like. A document in the PDF format is also such a file. A still digital video camera generates a data file for each picture that is stored on a memory card. A cellular telephone utilizes data from files on an internal memory card, such as a telephone directory. A PDA stores and uses several different files, such as an address file, a calendar file, and the like. In any such application, the memory card may also contain software that operates the host.

In FIG. 7, a continuous logical address space 161 is large enough to provide addresses for all the data that may be stored in the memory system. Typically the logical address space is somewhat smaller than the physical address space of the memory array so that there is some additional space in the memory array. The host logical address space is typically divided into increments of clusters of data. Each cluster may be designed in a given host system to contain a number of sectors of data, somewhere between 4 and 64 sectors being typical. A standard sector contains 512 bytes of data.

Three Files 1, 2 and 3 are shown in the example of FIG. 7. An application program running on the host system creates each file as an ordered set of data and identifies it by a unique name or other reference. Enough available logical address space not already allocated to other files is assigned by the host to File 1. File 1 is shown to have been assigned a contiguous range of available logical addresses. Ranges of addresses are also commonly allocated for specific purposes, such as a particular range for the host operating software, which are then avoided for storing data even if these addresses have not been utilized at the time the host is assigning logical addresses to the data.

When a File 2 is later created by the host, the host similarly assigns two different ranges of contiguous addresses within the logical address space 161, as shown in FIG. 7. A file need not be assigned contiguous logical addresses but rather can be fragments of addresses in between address ranges already allocated to other files. This example then shows that yet another File 3 created by the host is allocated other portions of the host address space not previously allocated to the Files 1 and 2 and other data.

The host keeps track of the memory logical address space by maintaining a file allocation table (FAT), where the logical addresses the host assigns to the various host files are maintained. The FAT table is typically stored in the non-volatile memory, as well as in a host memory, and is frequently updated by the host as new files are stored, other files deleted, files modified and the like. When a host file is deleted, for example, the host then deallocates the logical addresses previously allocated to the deleted file by updating the FAT table to show that they are now available for use with other data files.

The host is not concerned about the physical locations where the memory system controller chooses to store the files. The typical host only knows its logical address space and the logical addresses that it has allocated to its various files. The memory system, on the other hand, through a typical host/card interface, only knows the portions of the logical address space to which data have been written but does not know the logical addresses allocated to specific host files, or even the number of host files. The memory system controller converts the logical addresses provided by the host for the storage or retrieval of data into unique physical addresses within the flash memory cell array where host data are stored. A block 163 represents a working table of these logical-to-physical address conversions, which is maintained by the memory system controller.

The memory system controller is programmed to store data files within the blocks and metablocks of a memory array 165 in a manner to maintain the performance of the system at a high level. Four planes or sub-arrays are used in this illustration. Data are preferably programmed and read with the maximum degree of parallelism that the system allows, across an entire metablock formed of a block from each of the planes. At least one metablock 167 is usually allocated as a reserved block for storing operating firmware and data used by the memory controller. Another metablock 169, or multiple metablocks, may be allocated for storage of host operating software, the host FAT table and the like. Most of the physical storage space remains for the storage of data files. The memory controller does not know, however, how the data received has been allocated by the host among its various file objects. All the memory controller typically knows from interacting with the host is that data written by the host to specific logical addresses are stored in corresponding physical addresses as maintained by the controller's logical-to-physical address table 163.

In a typical memory system, a few extra blocks of storage capacity are provided than are necessary to store the amount of data within the address space 161. One or more of these extra blocks may be provided as redundant blocks for substitution for other blocks that may become defective during the lifetime of the memory. The logical grouping of blocks contained within individual metablocks may usually be changed for various reasons, including the substitution of a redundant block for a defective block originally assigned to the metablock. One or more additional blocks, such as metablock 171, are typically maintained in an erased block pool. When the host writes data to the memory system, the controller converts the logical addresses assigned by the host to physical addresses within a metablock in the erased block pool. Other metablocks not being used to store data within the logical address space 161 are then erased and designated as erased pool blocks for use during a subsequent data write operation.

Data stored at specific host logical addresses are frequently replaced by new data as the original stored data become obsolete. The memory system controller, in response, writes the new data in an erased block and then changes the logical-to-physical address table for those logical addresses to identify the new physical block to which the data at those logical addresses are stored. The blocks containing the original data at those logical addresses are then erased and made available for the storage of new data. Such erasure often must take place before a current data write operation may be completed if there is not enough storage capacity in the pre-erased blocks from the erased block pool at the start of writing. This can adversely impact the system data programming speed. The memory controller typically learns that data at a given logical address has been rendered obsolete by the host only when the host writes new data to their same logical address. Many blocks of the memory can therefore be storing such invalid data for a time.

The sizes of blocks and metablocks are increasing in order to efficiently use the area of the integrated circuit memory chip. This results in a large proportion of individual data writes storing an amount of data that is less than the storage capacity of a metablock, and in many cases even less than that of a block. Since the memory system controller normally directs new data to a metablock from the erased block pool, this can result in portions of metablocks going unfilled. If the new data are updates of some data stored in another metablock, remaining valid metapages of data from that other metablock having logical addresses contiguous with those of the new data metapages are also desirably copied in logical address order into the new metablock. The old metablock may retain other valid data metapages. This results over time in data of certain metapages of an individual metablock being rendered obsolete and invalid, and replaced by new data with the same logical address being written to a different metablock.

In order to maintain enough physical memory space to store data over the entire logical address space 161, portions of the memory that are occupied by obsolete data may be reclaimed in a garbage collection operation. Erased space may also be reclaimed by consolidation where the erased space is in blocks that contain valid data and consolidating the valid data in fewer blocks allows blocks to be added to the erased block pool. Therefore, blocks are subject to garbage collection or consolidation to reclaim memory space for reuse. It is also desirable to maintain sectors of data within the metablocks in the same order as their logical addresses as much as practical, since this makes reading data in contiguous logical addresses more efficient. So data consolidation and garbage collection are typically performed with this additional goal. Some aspects of managing a memory when receiving partial block data updates and the use of metablocks are described in U.S. Pat. No. 6,763,424. Garbage collection and consolidation are collectively referred to in this application as "reclaim" and operations performed as part of garbage collection or consolidation are referred to as "reclaim operations."

Reclaim Examples

During garbage collection, pages of valid data with contiguous or near contiguous logical address ranges are gathered from one or more source blocks containing obsolete data and re-written into a destination block. The destination block may be from an erased block pool or may contain some valid data. When all valid data pages have been copied from the one or more source blocks, they may be erased for future use. FIGS. 8A and 8B show an exemplary garbage collection operation. FIG. 8A shows valid data X, X+1 and X+2 from pages 0-2 of block 1 being copied from block 1 to block 3 and valid data X+3 being copied from page 1 of block 2 to block 3. After data X, X+1, X+2 and Y are copied to block 3, blocks 1 and 2 may be added to a pool of blocks that are ready for immediate erasure and are generally erased shortly afterwards. FIG. 8B shows the situation after garbage collection with blocks 1 and 2 erased and block 3 being filled with data. As a result of this garbage collection operation, the erased block pool has increased by one block, since blocks 1 and 2 are added to the erased block pool but block 3 is no longer in the erased block pool. In order to accomplish this data X, X+1, X+2 and X+3 are copied. The data units of this example are equal to the contents of a page and may contain one or more sectors of data. Alternatively, the data may not be in logical units of sectors so that the contents of a page may not have separately addressable units of uniform size. Similarly, other examples of reclaim operations may apply to data that is in logically addressable units of sectors, or in some other format. In this example, data X, X+1, X+2 and X+3 are copied so that they are stored sequentially in block 3. In other examples, data may be copied to a block where they are stored non-sequentially.

FIGS. 9A and 9B show another example of garbage collection. Here valid data Y are copied from block 2, which contains obsolete data in pages 0 and 2, and is copied to block 1 which contains only valid data. After data Y has been copied, only obsolete data remains in block 2, so block 2 is erased. FIG. 9B shows the situation after garbage collection with data Y stored in the previously erased page 3 of block 1 and with block 2 erased. Thus, in this example, no block from the erased block pool is needed. Where data Y is the amount of data filling one page of the memory array, only one page is copied and one block is erased in this operation, resulting in an additional erase block being added to the erased block pool. In this example, data Y are not logically related to data X, X+1, X+2. In other examples data may be copied to blocks containing data that are logically related.

Data compaction is a particular form of garbage collection that typically involves reading all valid data pages from a block and writing them to a new block or blocks, ignoring pages with invalid data in the process. The pages with valid data are also preferably arranged with a physical address order that matches the logical address order of the data stored in them. Data compaction may be performed on a block that has data stored in a non-sequential (chaotic) format so that after compaction the data is stored in a sequential format. The number of pages occupied in the new block will be less than those occupied in the old block since the pages containing obsolete data are not copied to the new block. The old block is then erased and made available to store new data. The additional pages of capacity gained by the consolidation can then be used to store other data.

FIGS. 10A and 10B show an example of data compaction. FIG. 10A shows block 1 filled with data some of which is obsolete and some of which is valid. The data stored in block 1 are not in sequential order. Block 1 is typical of a chaotic update block used in some memory designs such as those described in U.S. patent application No. 10/750,155. Pages 2 and 3 of block 1 contain valid copies of data Z+1 and Z+2, while pages 0 and 1 contain obsolete copies of these data. Where a chaotic update block is mapped to a limited logical address range, the block is compacted whenever it becomes full so that additional updates are possible within the logical address range of the block. FIG. 10B shows the situation after compaction. The valid data Z+1 and Z+2 of pages 2 and 3 of block 1 have been copied to block 2 and are arranged to be sequentially stored. One advantage of sequentially storing data is that it may not be necessary to maintain an index of the locations of different sectors, thus reducing the overhead associated with maintaining such an index. Block 2 contains erased space in pages 2 and 3 that is available for storing additional data. Block 1 is shown after all valid data have been copied to block 2 and block 1 has been erased. Thus, as a result of compaction, the erased block pool still has the same number of erased blocks, but there is space available for writing data in block 2 that was not previously available. Data from two pages are copied to achieve this compaction.

Data consolidation may be used to make space available for storage of data. In some memory systems, the erased space in the memory may not all be usable because it is in small portions that are distributed among blocks that also contain valid data. When new data are received that are not logically related to data stored in any block with sufficient space to program the data, it is desirable to program it to an erased block, not a partially full block. Such new data that are not logically related to already stored data are generally stored in an erased block from an erased block pool. After some time, there may be multiple blocks that have erased space that is not usable for logically unrelated new data. This results in wasted space. The valid data from such partially written blocks may be combined. For example, the valid data from two blocks that contain erased space may be combined so that the combined erased space forms an erased block.

FIG. 11A shows block 1 containing data X, X+1 and X+2 in pages 0-2 while block 2 contains data Y in page 0. Data Y are not logically related to data X, X+1 and X+2. Blocks 1 and 2 may be kept in a condition with erased space for some time to see if additional data are received that are sequential to data X+2 for block 1 or sequential to data Y for block 2. If no additional sequential data are received after some threshold time or after some other condition is met, blocks 1 and 2 may be marked for consolidation. A list may be maintained of blocks that are ready for consolidation and blocks may be selected from the list according to the amount of valid data they contain so that when combined they fill a block or come close to filling a block. FIG. 11B shows blocks 1 and 2 after consolidation. Data Y has been copied to block 1 and block 2 has been erased. This consolidation only requires copying of the data from one page (data Y from page 0 of block 2) in order to add a block to the erased block pool. It is generally desirable to consolidate in a manner that requires less copying, thus data Y are copied to block 1 instead of copying data X, X+1 and X+2 to block 2.

Data consolidation and garbage collection take time and can affect the performance of the memory system, particularly if data consolidation or garbage collection needs to take place before a command from the host can be executed. Such reclaim operations are normally scheduled by the memory system controller to take place in the background as much as possible, but this is not always possible. An example where execution of a host command can be delayed is where there are not enough pre-erased metablocks in the erased block pool to store all the data that the host wants to write into the memory and data consolidation or garbage collection is needed first to clear one or more metablocks of valid data, which can then be erased. Attention has therefore been directed to managing control of the memory in order to minimize such disruptions. Many such techniques are described in the following U.S. patent applications: Ser. No. 10/749,831, filed Dec. 30, 2003, entitled "Management of Non-Volatile Memory Systems Having Large Erase Blocks"; Ser. No. 10/750,155, filed Dec. 30, 2003, entitled "Non-Volatile Memory and Method with Block Management System"; Ser. No. 10/917,888, filed Aug. 13, 2004, entitled "Non-Volatile Memory and Method with Memory Planes Alignment"; Ser. No. 10/917,867, filed Aug. 13, 2004; Ser. No. 10/917,889, filed Aug. 13, 2004, entitled "Non-Volatile Memory and Method with Phased Program Failure Handling"; and Ser. No. 10/917,725, filed Aug. 13, 2004, entitled "Non-Volatile Memory and Method with Control Data Management."

A memory controller may also use data from the FAT table, which is stored by the host in the non-volatile memory, to more efficiently operate the memory system. One such use is to learn when data have been identified by the host to be obsolete by deallocating their logical addresses. Knowing this allows the memory controller to schedule erasure of the blocks containing such invalid data before it would normally learn of it by the host writing new data to those logical addresses. This is described in U.S. patent application Ser. No. 10/897,049, filed Jul. 21, 2004, entitled "Method and Apparatus for Maintaining Data on Non-Volatile Memory Systems." Other techniques include monitoring host patterns of writing new data to the memory in order to deduce whether a given write operation is a single file, or, if multiple files, where the boundaries between the files lie. U.S. patent application Ser. No. 11/022,369, filed Dec. 23, 2004, entitled "FAT Analysis for Optimized Sequential Cluster Management," describes the use of techniques of this type.

To operate the memory system efficiently, it is desirable for the controller to know as much about the logical addresses assigned by the host to data of its individual files as it can. Data files can then be stored by the controller within a single metablock or group of metablocks, rather than being scattered among a larger number of metablocks when file boundaries are not known. The result is that the number and complexity of data consolidation and garbage collection operations are reduced. The performance of the memory system improves as a result. But it is difficult for the memory controller to know much about the host data file structure when the host/memory interface includes the logical address space 161 (FIG. 7), as described above.

Reclaim with Logical-address-based Interface

Figure 12:
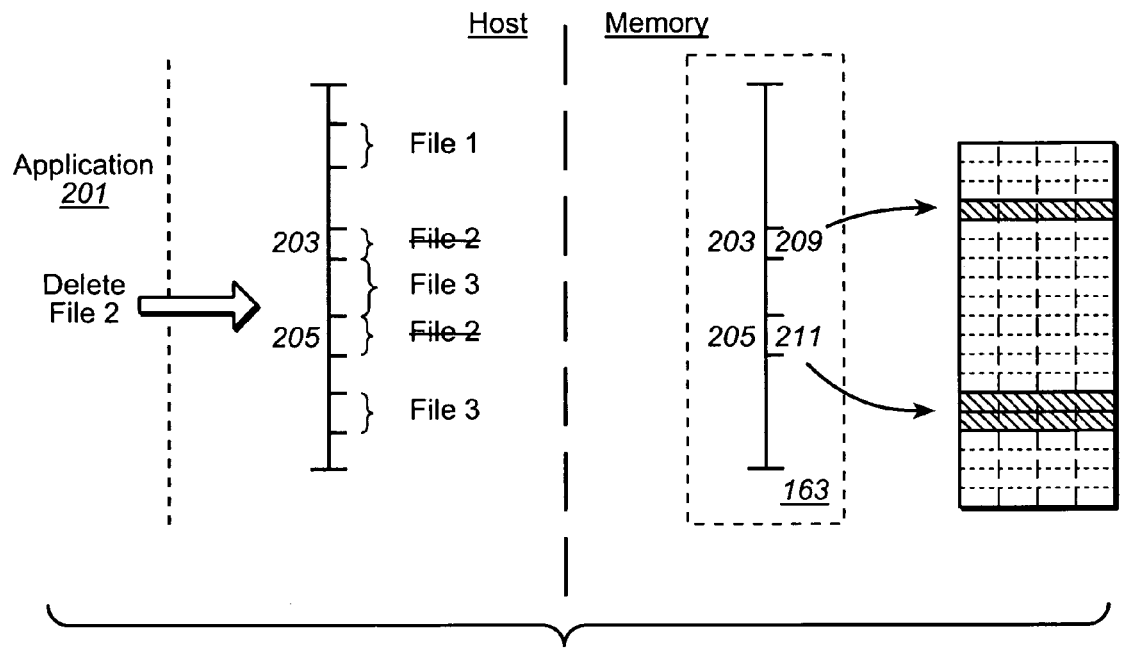
FIG. 12 illustrates deletion of a file by a host application where the file is stored in a non-volatile memory using the interface of FIG. 7.

FIG. 12 shows the operation of the host/memory interface of FIG. 7 when a file is deleted. An application 201 running on the host system determines that file 2 should be deleted in the memory. For example, application 201 running on a PC may determine that file 2 is no longer needed, based on user input or for other reasons. As a result, the application sends an instruction to delete file 2 to the driver portion of the host. In this case the storage of data is managed using a FAT to indicate logical addresses used for each file stored in the memory. For example, File 2 is shown having two separate logical address ranges 203 and 205. Each logical address range 203 and 205 may include multiple sequential clusters. While file 2 is shown having just two separate logical address ranges 203 and 205, files are frequently fragmented into many logical address ranges with other files mapped to the intervening logical addresses. The instruction to delete file 2 results in the FAT being modified so that clusters of logical address ranges 203 and 205 that were allocated to file 2 are deallocated and become available for subsequent allocation by the host. However, the deallocation of these clusters in the host's FAT does not generally cause any modification of the memory management structures used by the memory controller. Logical-to-physical address translation 163 includes a table maintained by the memory controller that records the physical addresses where clusters of data are stored. Address ranges 203 and 205 are mapped to physical address ranges 209 and 211 respectively. This record is not altered as a result of the "delete file 2" command from the application. Thus, the table maintains entries for logical address ranges 203 and 205. Also, the corresponding physical locations 209 and 207 remain filled with data even though this data is no longer needed by the application. Generally, the memory controller only changes the logical-to-physical address translation for logical address ranges 203 and 205 when new data are sent by the host with these addresses. Because the memory controller does not know when a cluster is deallocated, it generally maintains at least one entry for each logical address and so sees the entire logical address range as occupied. There is generally more physical space than the logical address range of the memory so that even with the entire logical address range filled with apparently valid data, there is additional space that may be erased space or may be occupied by obsolete data.

Figure 13:
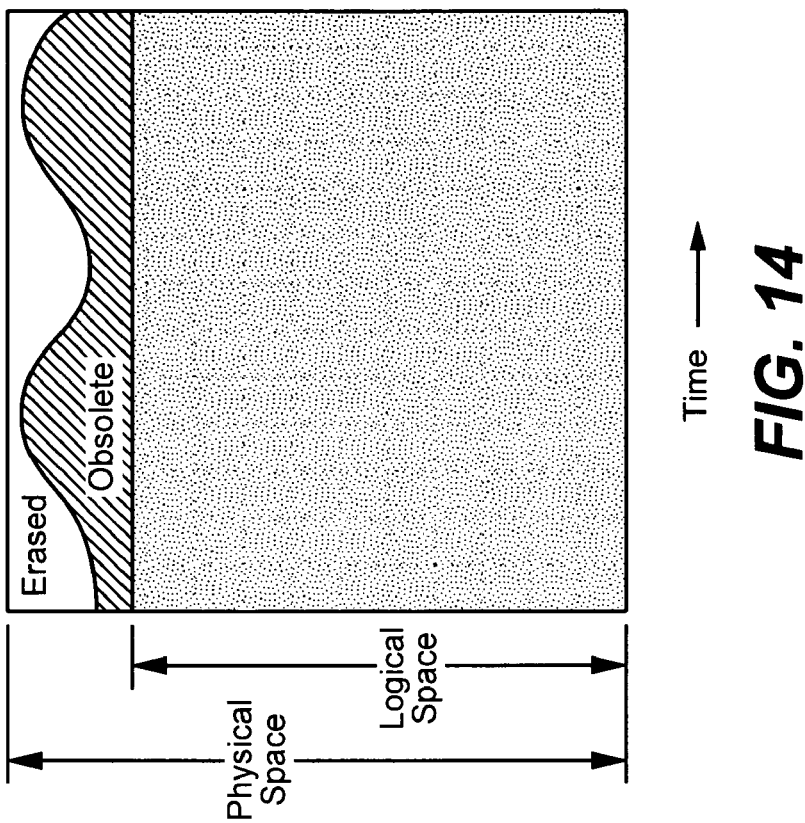
FIG. 13 shows an example of how space in a non-volatile memory may be managed.

FIG. 13 shows an example of how the physical space in a memory array may be managed as host data is written to the memory. The physical space is treated as being mostly full with valid data that corresponds to the full logical address range. The remaining space in the memory is made up of erased space and space occupied by obsolete data. As host data are programmed to the memory array, the amount of space occupied by obsolete data increases as shown. This is because when a new sector is received with a particular logical address it is stored at a new physical location that is recorded in logical-to-physical translation 163. This replaces a previously stored sector with the same logical address. The previously stored sector then becomes obsolete and the physical location of the previously stored sector is recorded as containing obsolete data. The erased space diminishes as the amount of obsolete data increases. At some point there is not enough erased space to continue programming host data. FIG. 13 shows no erased space left in the memory at time t1. So at time t1 no further host data can be programmed to the memory array. In other examples, programming may stop when some minimum amount of erased space remains in the memory array. At time t1, a garbage collection operation begins to reclaim space that is occupied by obsolete data. This operation ends at time t2 when all obsolete space has been reclaimed and is erased space. In other examples, the garbage collection operation may end before all possible space has been reclaimed, for example when just enough space has been reclaimed to allow programming of host data to continue. At time t2, programming of host data begins again and at time t3, writing of host data ceases and another garbage collection operation begins. The view shown in FIG. 13 is the memory controller's view of the condition of the data in the memory and is not always the same as the host's view. While the memory controller sees the logical space as full, the host may see the same space as largely free.

Managing the memory in the way shown by FIG. 13 has the disadvantage that between time t1 and t2, the memory is unavailable to the host. Therefore, no host data is written in the time period from t1 to t2. The time from t1 to t2 may be of considerable length because of the large number of pages that may have to be copied. In some cases, this time is so great that it causes the host to time out. That is, the host has a maximum time for writing a portion of data and the garbage collection necessary to allow writing of new data when there is insufficient erased space may exceed this maximum.

Figure 14:
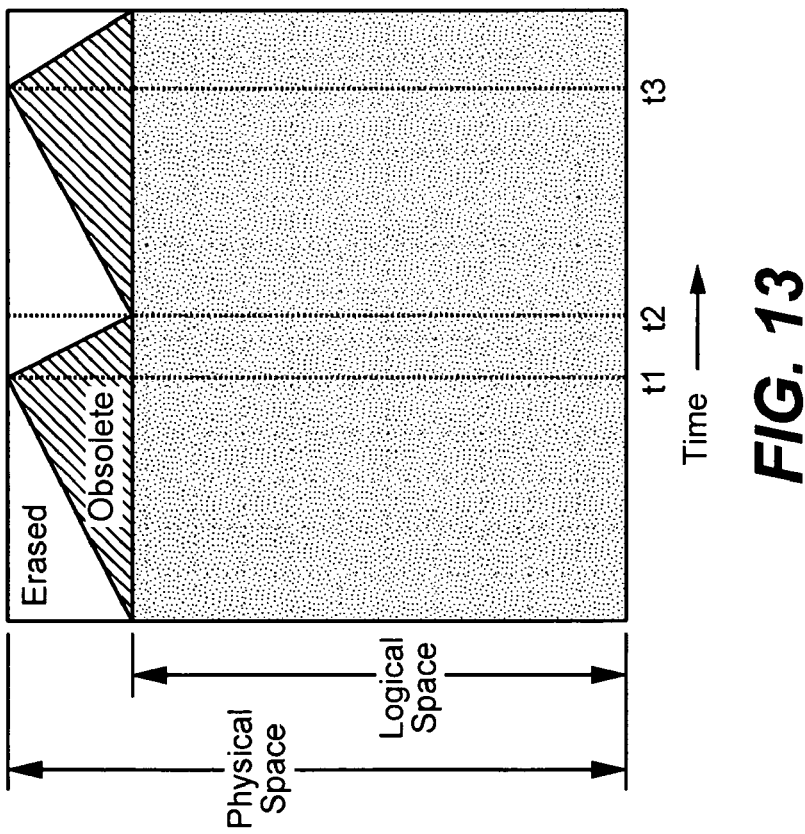
FIG. 14 shows another example of how space in a non-volatile memory may be managed.

FIG. 14 shows an alternative method of managing the memory where garbage collection is performed while there is still sufficient erased space to allow writing of host data. In this example, garbage collection is carried out before it is absolutely necessary. Garbage collection may be done between writing of host data in an interleaved manner as described in U.S. patent application No. 11/040,325. The trigger for beginning such interleaved garbage collection may be that the number of erased blocks reaches some threshold. Interleaved garbage collection operations slow down the programming of host data to the memory. However, the garbage collection operations may prevent the number of erased blocks diminishing to a point where host data can no longer be written. Thus, the risk of the host timing out or aborting the programming is reduced or eliminated. Interleaved garbage collection may stop when sufficient erased blocks are available so that programming speed is not unnecessarily affected. Thus, the amount of erased space varies as interleaved garbage collection is turned on and off or the rate of interleaved garbage collection changes.

Figure 15:
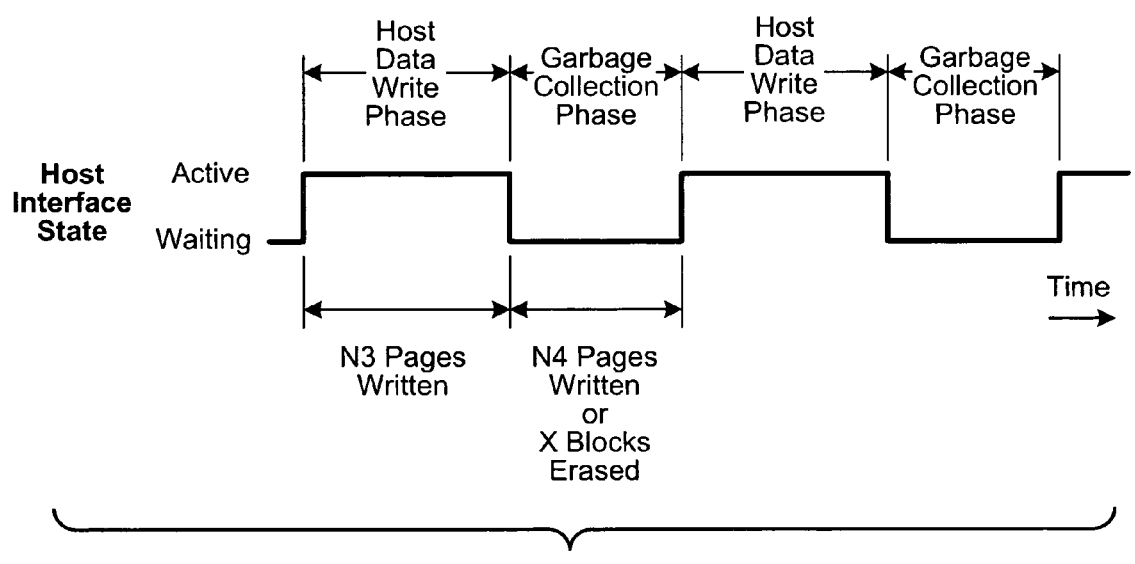
FIG. 15 shows interleaved host write operations and garbage collection operations.

FIG. 15 shows a timing diagram of garbage collection interleaved with writing of host data. N3 pages of host data are written, then N4 pages of data are written or x blocks are erased as part of a garbage collection operation. This cycle is repeated. In this way, the overhead associated with garbage collection is spread out over time instead of being concentrated at one time, which could cause a time-out. Consolidation, other reclaim operations or other housekeeping operations that may also be interleaved in this manner. Housekeeping operations in this context refers to operations that are initiated by the memory controller to maintain data in the memory array. Such operations may include wear leveling and data scrub operations.

Reclaim with File-based Interface

With some memory interfaces, additional information may be available to the memory controller to allow more efficient reclaim. Examples of such memory interfaces are described in the following U.S. patent applications: Ser. No. 11/060,249 entitled "Direct Data File Storage in Flash Memories"; Ser. No. 11/060,174, entitled, "Direct File Data Programming and Deletion in Flash Memories"; Ser. No. 11/060,248, entitled "Direct Data File Storage Implementation Techniques in Flash Memories" all filed on Feb. 16, 2005 and Provisional Patent Application No. 60/705,388, entitled "Direct Data File Storage in Flash Memories" filed on Aug. 3, 2005. Files are sent from the host to the memory without being mapped to logical addresses of a logical address range defined for the memory. Such a memory may be considered to have a file-based interface. In the memory, a file is stored mainly in metablocks that are dedicated to that file. The locations where the file is stored are recorded using a file identifier and offsets.

Figure 16:
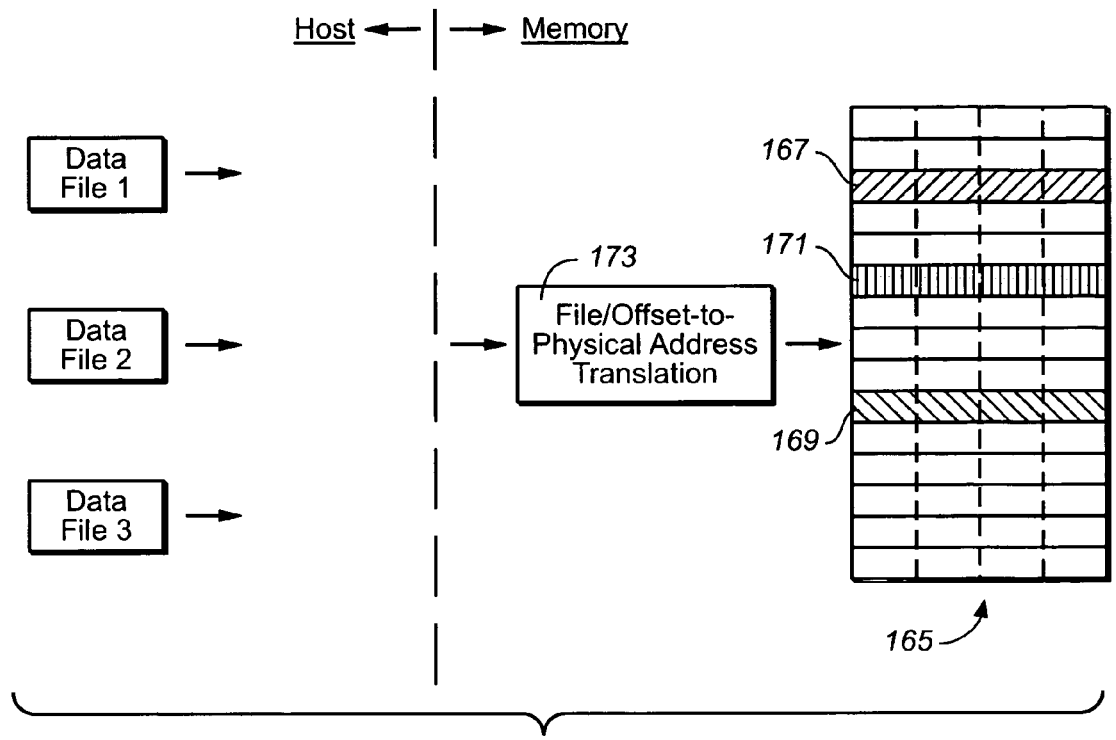
FIG. 16 shows a non-volatile memory having a file-based interface to a host.

FIG. 16 shows a memory interface using such direct data file storage, with files being sent to the memory and file/offset-to-physical address translation 173 taking place in the memory. Such memories may maintain files in a way that reduces fragmentation so that most metablocks contain data from only one file. In such memories, the memory controller has more information available regarding the data being stored. In particular, because the memory controller identifies the data by file, it is able to store files in a manner that is file-based.

Figure 17:
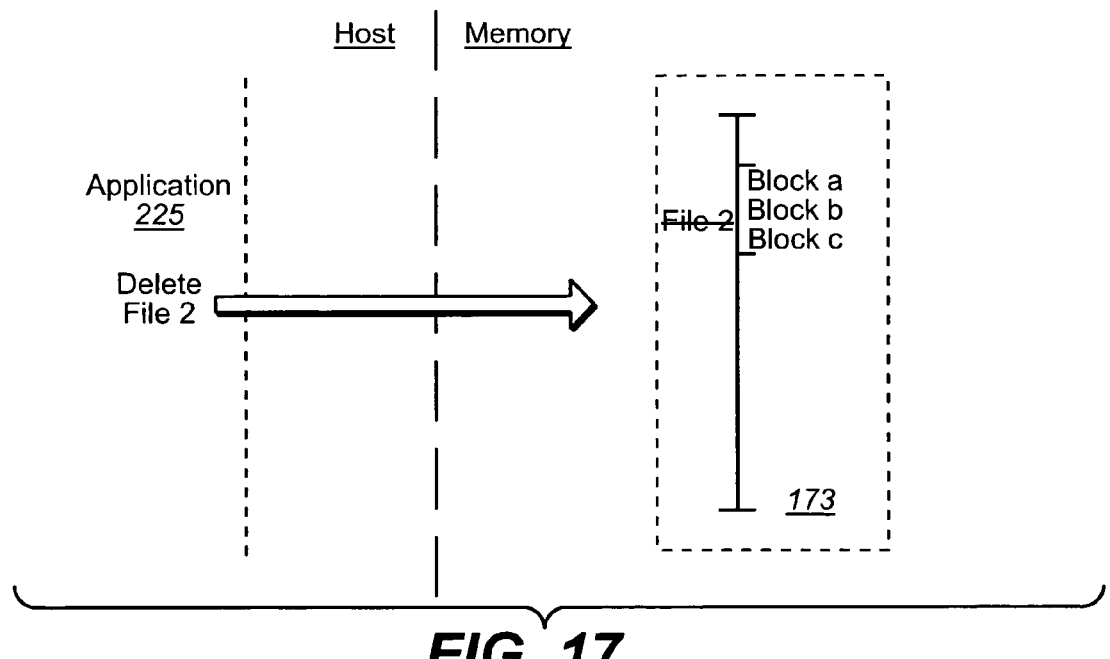
FIG. 17 illustrates deletion of a file by a host application where the file is stored in a non-volatile memory using the interface of FIG. 16.

FIG. 17 shows what happens when an application deletes a file that is stored in a memory system using the interface of FIG. 16. Application 225 sends a command indicating that file 2 should be deleted. This command is sent from the host to the memory without any need to identify the file by logical sector address. A file identifier may be used by the host to identify the file. File 2 was mapped to blocks a, b and c and the mapping recorded by file/offset-to-physical translation 173. The command causes file/offset-to-physical translation 173 to be updated to reflect that file 2 is deleted. As a result, blocks a, b and c are scheduled for garbage collection so that they can be reused for new data. Thus, garbage collection may be initiated by the deletion of a file by an application instead of waiting until replacement data are to be stored in the memory array as is the case for memories using logical sector addresses. The memory controller does not always see a full logical address space in this case. Instead, the memory controller has accurate information regarding validity of data stored in the memory. At some times, the memory controller may recognize that the memory array contains little or no valid data. At other times, the memory controller may see the memory array as full or almost full with valid data. With such information regarding valid and obsolete data in the memory array, reclaim may be managed in more efficient ways than before.

Figure 18:
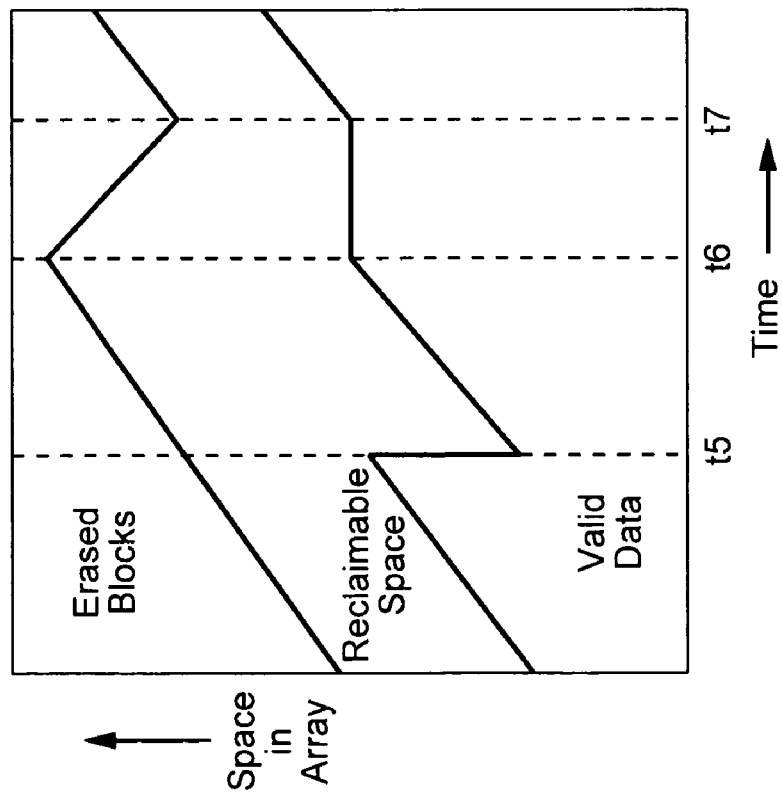
FIG. 18 illustrates an example of management of space in a non-volatile memory having a file-based interface.

FIG. 18 shows an example of a memory reclaim system operating on a memory that uses a direct data file interface. FIG. 18 shows the condition of the memory array over time as host data are written. The view shown represents the controller's view, which in this case is consistent with the host's view. Here, only a relatively small part of the memory is seen as containing valid data with the rest of the memory consisting of erased blocks and reclaimable space. Reclaimable space consists of space that is occupied by obsolete data and also space that is erased but is not in erased blocks. While in some memories such scattered portions of erased space may be used to store additional data, in other systems such erased space is consolidated into erased blocks, which are then used to store data. FIG. 18 shows a steady increase in the amount of valid data until a time t5. During this time, the amount of reclaimable space stays constant because no reclaim operation is performed. The space in erased blocks diminishes as valid data are written to erased blocks during this period. At time t5, one or more files are deleted and the data from those files stored in the memory array becomes obsolete. Thus, the amount of space occupied by valid data is diminished and the amount of reclaimable space is increased accordingly. Then, from time t5 to t6, more data is programmed to the memory array, again increasing the amount of valid data and reducing the space in erased blocks. At time t6, the memory reaches a point where a reclaim operation is considered necessary to allow programming of further data. This point may be reached when the space in erased blocks reaches some threshold or may be based on some other criteria. From time t6 to t7, reclaim operations are performed to convert some of the reclaimable space to erased blocks. During these reclaim operations, no new data are written to the memory array so that the amount of space occupied by valid data remains constant. At time t7, reclaim operations cease and programming of new data begins again. This system is similar to systems described before, where reclaim operations are performed only when necessary. One disadvantage of such a system is that the time from t6 to t7 may exceed a time limit so that the host aborts a write operation. Instead of performing reclaim operations only when necessary, it is possible to perform reclaim operations before they are necessary in a way that does not have a great impact on host write operations. Especially in memories that have more complete information about the amount of obsolete data stored in the memory array, such as those using a direct data file storage system, it is possible to schedule reclaim operations in an intelligent manner so that they have little impact on host write operations.

Figure 19:
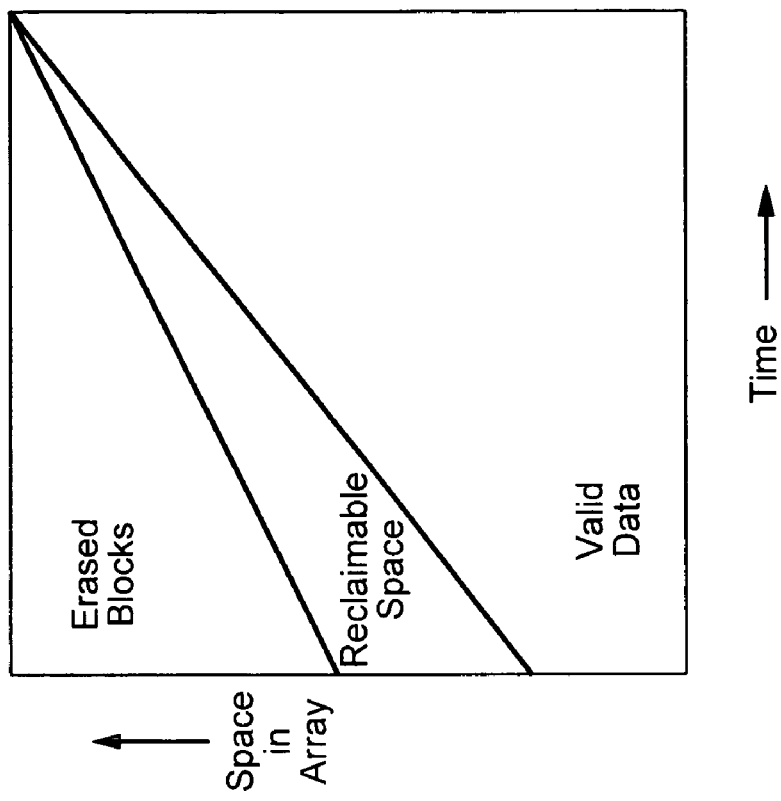
FIG. 19 illustrates another example of management of space in a non-volatile memory having a file-based interface, this example providing a constant rate of programming of host data until the memory array is full.

FIG. 19 shows a model of how space may be managed in a memory array. Valid data increases at a constant rate until the memory array is filled with valid data. At the same time, reclaimable space diminishes as reclaim operations convert reclaimable space to erased blocks. A system to manage space in a memory array in this way carries out reclaim operations according to a schedule so that individual reclaim operations are distributed between individual host write operations to provide a constant speed of writing host data. To do this, the controller may estimate the amount of additional valid data that it would take to fill the memory array and estimate the number of reclaim operations needed before the memory would be full. The reclaim operations are then scheduled at a rate that spreads out reclaim operations evenly over the remaining time. This ensures that the memory does not run out of erased blocks prematurely. Reclaim operations may be interleaved between operations that program new data to the memory array as before. Reclaim operations include copying portions of data from one block to another and erasing blocks that contain no valid data. The rate of reclaiming space may be determined by an interleave ratio, the ratio of a number of reclaim operations to a number of host write operations. In some cases, block erase operations are ignored for calculating this ratio because there are many more copy operations than erase operations. Then the ratio becomes a ratio of write operations for reclaim to write operations for new data.

Figure 20:
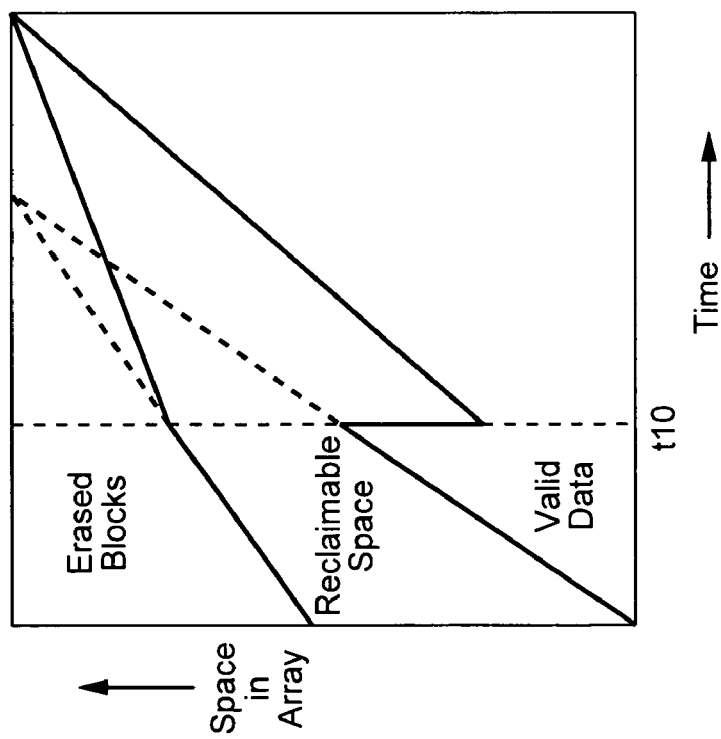
FIG. 20 shows another example of management of space in a non-volatile memory having a file-based interface having adaptive scheduling of reclaim that adapts in response to deletion of a file.

FIG. 20 illustrates what happens in such a system when one or more files are deleted at time t10. Prior to t10, space occupied by valid data is increasing and both reclaimable space and the space in erased blocks are diminishing as the amount of valid data increases. The reclaimable space is being reclaimed at a rate that ensures all reclaimable space would be reclaimed when the memory becomes full as indicated by the broken lines. At time t10, one or more files are deleted so that space that was previously occupied by valid data is occupied by obsolete data and so becomes reclaimable space. After t10 the memory array is capable of storing more valid data, but requires additional reclaim operations to do so. Therefore, the controller recalculates the rate at which reclaim operations should be performed. This provides an adaptive scheduling system that responds to changes in the status of data stored in the memory array. The rate of reclaiming is modified as a result and the rate of programming valid data is also changed because the rate of reclaiming affects the rate of programming valid data. An adaptive reclaim scheduling system may recalculate an interleave ratio periodically or when triggered by a host command or triggered by some other event.

Figure 21:
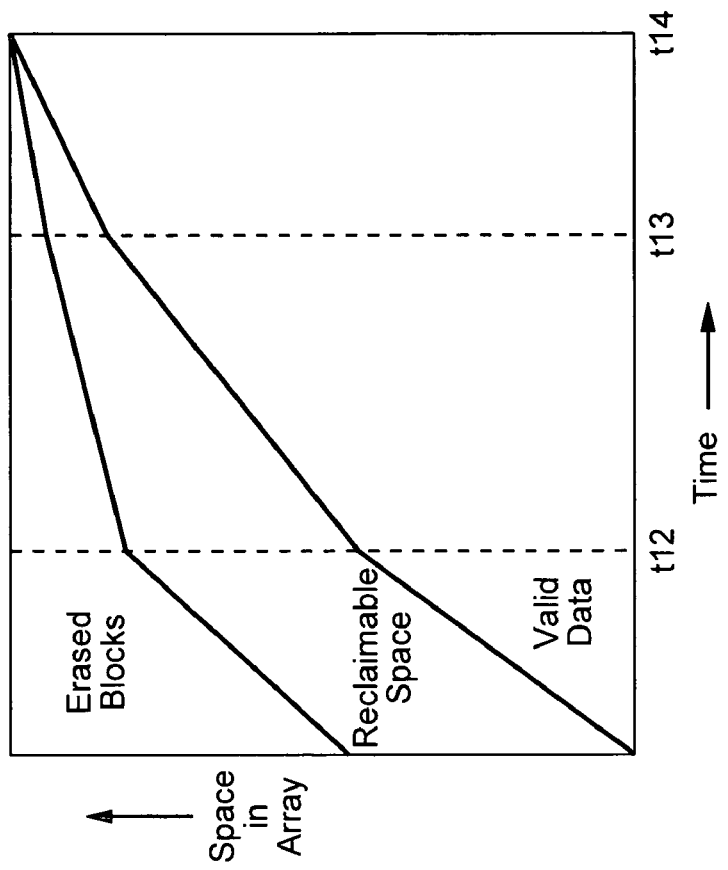
FIG. 21 shows another example of management of space in a non-volatile memory having a file-based interface in three modes, an initial mode having a minimal reclaim rate, an adaptive mode having an adaptively scheduled reclaim rate and a final mode having a maximum reclaim rate.

FIG. 21 shows another example of memory management where there are three different modes of reclaim. In a first mode, before t12, no reclaim operations are performed during writing of host data. The amount of valid data increases at the same rate that the amount of space in erased blocks decreases. The amount of reclaimable space remains approximately the same because no data is made obsolete during this time. Some blocks may have valid data stored in a way that leaves a portion of the block erased and unused. These erased portions may be reclaimed by consolidating the valid data so that the erased space is consolidated in one or more erased blocks. Thus, there may be some increase in reclaimable space in this mode even where no data becomes obsolete. In some examples, a minimum rate of reclaim may be maintained in this first mode so that the reclaim rate is never at zero. Because the reclaim rate is low or zero, the rate of programming host data is high in this first mode.

In a second mode, from t12 to t13, reclaim operations are performed according to an adaptive schedule as shown in FIGS. 19 and 20. Thus, the rate of reclaim is calculated and reclaim operations are interleaved between programming of new data so that the reclaimable space diminishes as the memory fills. The rate of programming new data is slightly lower in the second mode than in the first mode because of the interleaved reclaim operations. The second mode may begin when the valid data in the memory exceeds a threshold, when the space in erased blocks drops below a threshold or based on some other criteria.

In a third mode, after t13, reclaim operations are performed at a maximum rate so that there are erased blocks available for writing new data. The increase in the rate of reclaim operations causes a decrease in the rate of programming of host data. The third mode may begin when the amount of valid data exceeds a threshold or when the amount of space in erased blocks drops below a threshold or based on some other criteria.

Adaptive Scheduling-detailed Example

Figure 22:
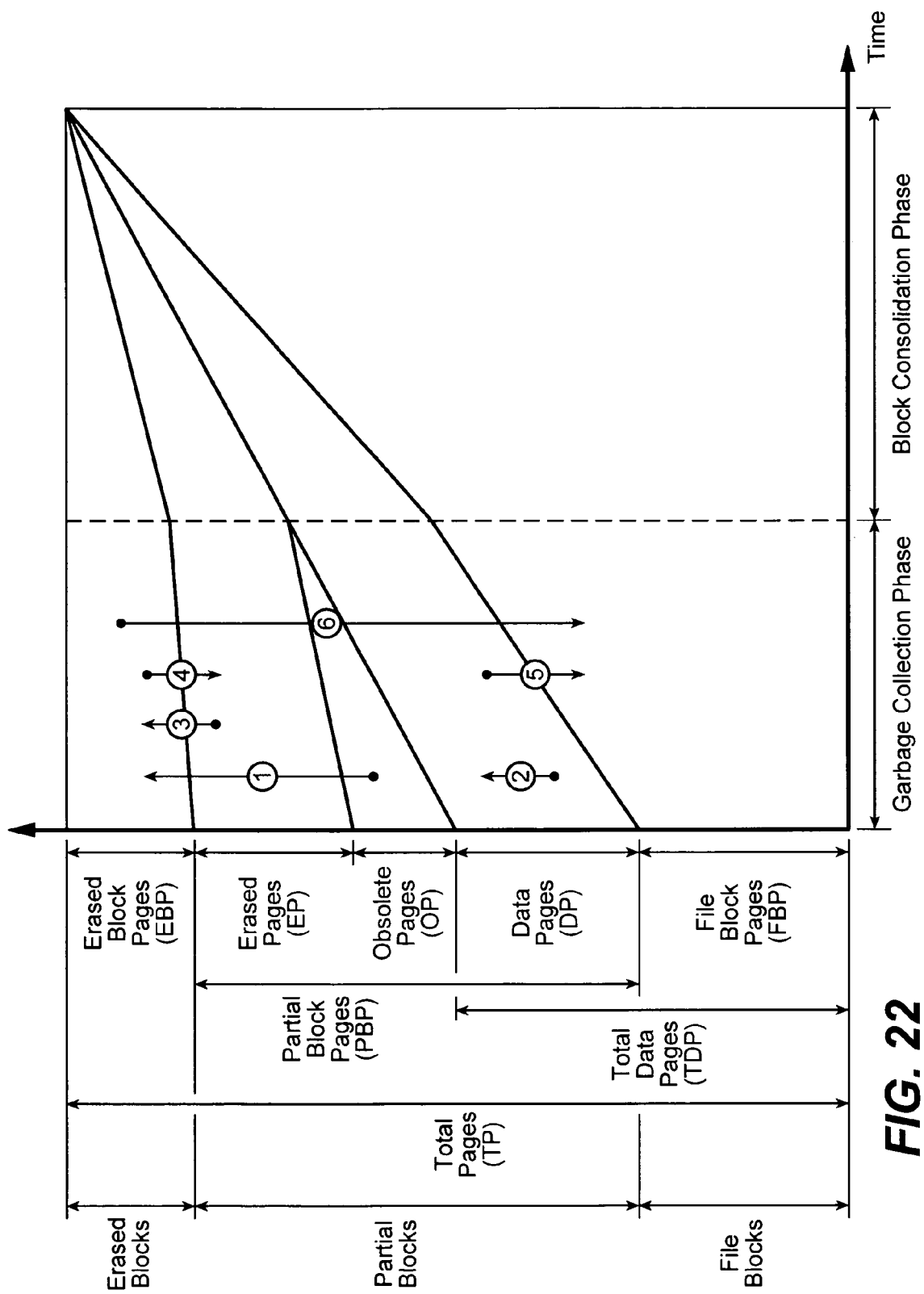
FIG. 22 shows a detailed view of management of space in a non-volatile memory having a file-based interface including portions of the memory array in various conditions and possible transitions of data between those conditions.

Managing a non-volatile memory so that it carries out reclaim operations according to an adaptive scheduling system while maintaining a constant rate of programming of host data will now be described in detail using an example where the memory has a direct data file storage interface. This example shows how an appropriate interleave ratio may be calculated from parameters that are monitored by a memory controller. The different conditions of pages of memory space over time for such a memory are illustrated in detail in FIG. 22. Also shown are a number of transitions that are possible for pages or blocks in a memory array. The memory array is comprised of blocks and each block contains multiple pages. The terminology "blocks" and "pages" will be used for this example, but the example also works in memories having metablocks and metapages as units of erase and programming respectively. Blocks are treated as being in one of three conditions at any time and pages within these blocks are treated as being in one of five conditions. The numbers of pages in each of these five conditions over time are represented in FIG. 22.

Classifications of Blocks for Data Storage

File blocks: File blocks are full of host data and contain no obsolete data. In practice, a file block may be allowed to contain a minimal number of unprogrammed pages, for example 2.

Partial blocks: Partial blocks contain some host data and also some erased pages and/or obsolete pages.

Erased blocks: Fully erased blocks in the erased block pool.

In addition to these three categories, some blocks may be full of obsolete data. For example, immediately after a file is indicated to be deleted or erased by a host, the blocks containing the file are scheduled for garbage collection. Some of these blocks are full of data. However, because such blocks are rapidly erased without requiring a lot of resources, these blocks are not considered for purposes of the present calculation.

Classifications of Pages for Data Storage

The following is a list of terms used to classify pages of the memory array according to the condition of the page and the other pages in the same block. The number of pages in each condition is shown in FIG. 22.

File block pages (FBP): This is the number of pages of valid host data contained in file blocks.

Data pages (DP): This is the number of pages of valid host data contained in partial blocks.

Obsolete pages (OP): This is the number of pages of obsolete host data contained in partial blocks.

Erased pages (EP): This is the number of erased pages contained in partial blocks. Obsolete Pages (OP) and Erased Pages (EP) together may be considered to form the reclaimable space in the memory array.

Erased block pages (EBP): This is the number of erased pages contained in erased blocks. Pages that may exist in blocks containing only obsolete data are ignored in this list because such pages do not exist for long and do not present a significant burden in terms of garbage collection necessary to reclaim them.

In addition to the five mutually exclusive categories listed above, two other numbers that relate to pages in a memory array are total pages and total data pages. These terms describe pages that are in the above categories. These numbers are tracked by the memory controller.

Total pages (TP): This is the total number of pages in the device available for data storage, and represents the data capacity of the device.

Total data pages (TDP): This is the number of pages containing valid host data, at any time. Data pages may be in either file blocks or partial blocks.

Phases of data copy operations: There are two phases of data copy operations, but they do not need to be considered separately in the analysis of adaptive scheduling below.

(1) Garbage collection phase: Obsolete pages exist in the device, and garbage collection operations are performed to eliminate them.

(2) Block consolidation phase: Block consolidation operations are performed to recover erased capacity tied up in partial blocks.

Generally, it is better to do garbage collection first and defer block consolidation because blocks containing only valid and erased space may still be used without consolidation if the host writes data to the same file as the valid data. Even where a file is closed, the file may be reopened and the data written to the program block. A block with obsolete data must be garbage collected before it can be used again so that there is no advantage to deferring such garbage collection.

Page Transitions Resulting from Device Operations

The following page transitions are shown in FIG. 22:

Obsolete page to Erased block page (1): Occurs when a block containing obsolete pages is erased after valid data pages have been copied from it.

Data page to Data page (2): Relates to data pages being copied from a source block to a destination block Erased page to Erased block page (3): After all valid data pages have been copied from a source block to destination blocks, erased pages that were programmed in the destination blocks effectively become erased block pages in the source block when the source block is erased.

Erased block pages to Erased pages (4): After valid data pages are copied from a source block to an erased block, the remaining erased block pages in the erased block become erased pages Data pages to File block pages (5): Valid data pages in a partial block become file block pages when the block becomes full.

Erased block pages to File block pages (6): An erased block page becomes a File block page when the block has been filled by data written by a host.

FIG. 23 shows examples of how these transitions occur in blocks of a memory array. FIG. 23A shows four blocks A-D in a memory array, with different blocks having different amounts of data in different conditions. Block A is filled with valid data because pages 0-3 each contain valid data (indicated by shading). Therefore, Block A is considered to be a File Block. Block B includes page 0 that contains valid data (data X), pages 1 and 2 that contain obsolete data (indicated by hatching) and page 3 that is in an erased state. Because block B contains some valid data, but is not full of valid data, block B is considered a Partial Block. Block C has pages 0 and 1 that are filled with valid data and pages 2 and 3 that are in an erased state. Block C is also considered to be a Partial Block because it contains some valid data, but is not full of valid data. Block D is fully erased, containing no data and is therefore considered an Erased Block.

Figure 23A:
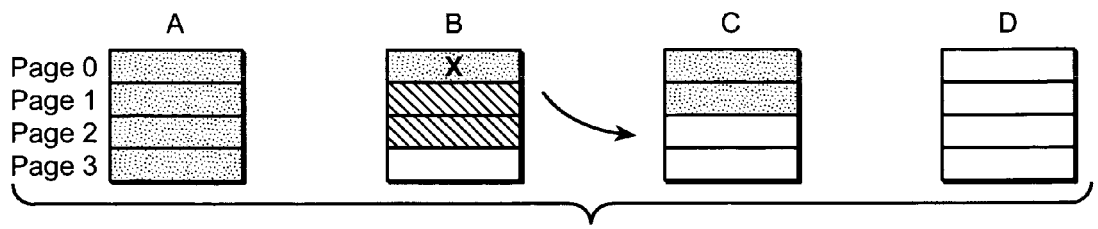
FIGS. 23A-23D show blocks of a memory array containing data undergoing transitions corresponding to those of FIG. 22.
Figure 23B:
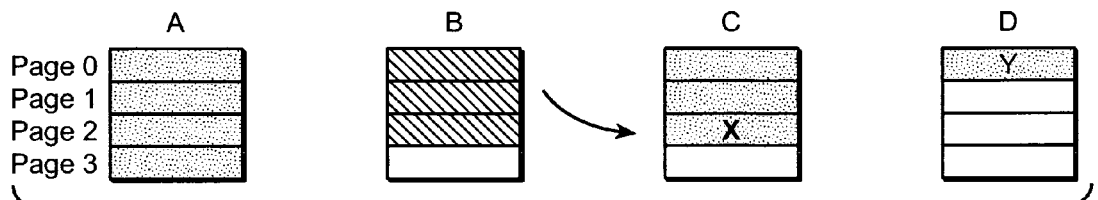

Because block A of FIG. 23A is the only File Block, the number of File Block Pages (FBP) is equal to the number of pages in block A, that is, four. The number of Data Pages (DP) is the number of valid pages in blocks B and C and is therefore equal to three. The number of Obsolete Pages (OP) is the number of pages filled with obsolete data in blocks B and C and is equal to two. The number of Erased Pages (EP) is the number of pages in an erased state in blocks B and C and is equal to three. Because block D is the only Erased Block, the number of Erased Block Pages (EBP) is the number of pages in block D and is equal to four. The Total Pages (TP) in this example is simply the total number of pages in all blocks, here sixteen pages. The Total Data Pages (TDP) is the number of pages containing valid data, here seven pages.

Figure 23C:
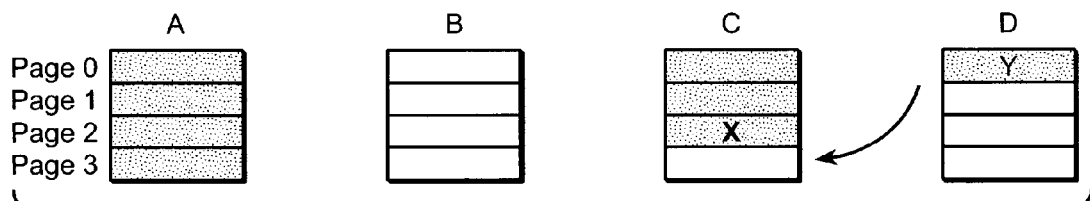
Figure 23D:
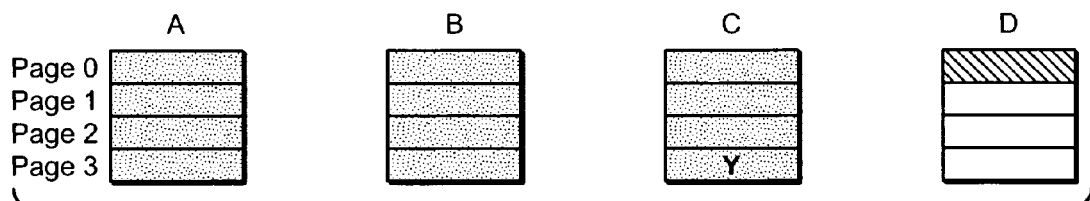

FIG. 23A shows valid data X from page 0 of block B being copied to page 2 of block C. This is an example of a transition of type (2) DP to DP. Subsequently, in FIG. 23B only obsolete data remain in block B so that block B may be put in a queue for erase at this point. New valid data Y are written to block D in FIG. 23B so that page 0 of block D becomes a Data page. Pages 1-3 of block D change from being Erased Block Pages to being Erased Pages in a type (4) transition. FIG. 23C shows blocks A-D after block B is erased. Pages 0-2 are converted from Obsolete Pages to Erased Block Pages in a transition of type (1). Page 3 of block B changes from being an Erased Page in a partial block to being an Erased Block Page in an erased block in FIG. 23C. This is an example of a type (3) transition. Also in FIG. 23C, valid data Y are copied from page 0 of block D to page 3 of block C, resulting in block C becoming full of valid data as shown in FIG. 23D, Thus, block C of FIG. 23D is considered a File Block. Pages 0-2 of block C that were previously Data Pages become File Block Pages when block C becomes a File Block in a type (5) transition. Also in FIG. 23D, block B is programmed with valid data that fills block B. The pages of block B change from being Erased Block Pages to being File Block Pages in a type (6) transition.

One objective of the present adaptive scheduling scheme is to interleave host writes and reclaim operations to provide a constant rate of programming of host data. Thus the rate of increase of Total Data Pages (TDP) is constant until Total Data Pages (TDP) equals Total Pages (TP), i.e. until the memory is full. Certain approximations are made in calculating various parameters in the present example. However, other examples may be based on other assumptions or may carry out calculations in other ways. In the present calculation, the data group structure of the data being copied is ignored. Therefore, data groups may be split when copied. Data pages may be copied from a source block to fill available erased pages in a destination block, then the remainder may be copied to a separate destination block.

The controller maintains certain parameter values that are used to calculate the appropriate interleave ratio between reclaim operations and new data writes. The calculation presented here uses pages as the fundamental unit of data for calculating, however other units, such as blocks or metablocks may also be used. An interleave ratio may be calculated using only the parameter values maintained by the controller, Total Pages (TP), Total Data Pages (TDP), Partial Block Pages (PBP) and Erased Block Pages (EBP) as described below.

Derivation of (Host Data):(Copy Data) Interleave Ratio

The number of additional pages of host data that can be written to the device before the device becomes full is given by the expression Host data to be written=TP−TDP The number of Erased Pages (EP) and Data Pages (DP) can also be written using the parameters monitored by the controller as follows.

$$\text{Erased pages}(EP) = TP - TDP - OP - EBP$$

$$\begin{aligned}\text{Data pages}(DP) &= PBP - EP - OP \\ &= PBP - (TP - TDP - OP - EBP) - OP \\ &= TDP + PBP + EBP - TP\end{aligned}$$

The amount of valid data that must be copied is determined based on the approximation that all partial blocks contain the same number of valid Data Pages. If N is the total number of pages in a block, the average number of valid pages in a partial block is N*DP/PBP.

Only a fraction of the data pages existing in partial blocks need to be copied. The remainder exist in partial blocks that become destination blocks to which data is copied. It is assumed that partial blocks are used as destination blocks for all copying and that erased blocks do not have to be used. The number of blocks from which data must be copied is equal to the number of erased blocks that will be produced since each partial block that is erased has valid data copied from it first. The number of erased blocks produced=(PBP−DP)/N.

Thus, multiplying the number of blocks to be erased by the average number of valid pages per block gives an approximation for the amount of data to be copied to reclaim all reclaimable space in the memory array.

$$\begin{aligned}\text{Data to be copied} &= \{N*DP/PDP\}*\{(PBP-DP)/N\} \\ &= DP*(PBP-DP)/PBP \\ &= (TDP+PBP+EBP-TP)* \\ &\quad (PBP-TDP-PBP-EBP+TP)/PBP \\ &= (TDP+PBP+EBP-TP)* \\ &\quad (TP-TDP-EBP)/PBP\end{aligned}$$

Note that this over-estimates the amount of data to be copied, as source blocks for copy operations are actually selected as blocks with the lowest amount of valid data to be copied. The rate of copying data based on the simplification that all partial blocks contain the same proportion of data pages will therefore be slightly higher than necessary.

$$\begin{aligned}\text{(host data):(copy data)} \\ \text{interleave ratio} &= \text{(host data to be written)}/ \\ &\quad \text{(data to be copied)} \\ &= (TP-TDP)*PBP/ \\ &\quad (TDP+PBP+EBP-TP)/ \\ &\quad (TP-TDP-EBP)\end{aligned}$$

This gives an interleave ratio that allows programming of host data to continue at a constant rate until the memory is full. The ratio may be updated periodically or in response to some triggering event. This ratio is one example of a formula that may be used to schedule reclaim operations to allow a constant rate of host data programming. Other formulae may also be used. A formula to calculate an interleave ratio may be based on calculations such as those above or may be based on experience in actual memories. A formula may be simplified by making additional assumptions about which factors to ignore in the calculation. Alternatively, a more complex formula could take into account additional factors such as the time taken by erasing blocks or the possibility that erased blocks might be needed as destination blocks for garbage collection.

While the memory of the above example has a file-based host interface, aspects of the present invention may be applied in memories that use a sector-based host interface or some other host interface. While some memories with sector-based interfaces may lack sufficient information to benefit greatly from applying the techniques described, some improvement in performance may be achieved. In addition, some memories having sector-based interfaces may analyze the FAT or otherwise gain additional information about the condition of the stored data. Some hosts may use additional commands to provide information to the controller regarding the stored data. Such information may be used to schedule reclaim at an earlier time than would otherwise be possible.

Host Operation

In some examples, reclaim operations in a non-volatile memory may be managed differently in different modes. As described previously, reclaim operations may operate at some minimum rate (including zero in some examples) in a first mode, operate in an adaptive manner in a second mode and operate at a maximum rate in a third mode. The reclaim mode may be selected by the memory controller according to predetermined criteria. The reclaim mode may also be controlled by a host in some examples. The host may determine which of the three described modes is selected. In addition, the host may have commands to select the appropriate reclaim mode based on present host activity or expected host activity. A host system may be physically separate from the memory system as shown in FIG. 1. Alternatively, a processor within the memory card that is executing an on-card application may be considered as a host. Such a configuration is described in U.S. Provisional Application No. 60/705,388.

A first host command regarding the reclaim mode of a memory is a "Reclaim_on" command that allows continuous reclaim operations instead of interleaved operations. Reclaim operations done in this way are considered background operations because they do not cause any delay to execution of host commands and are transparent to the host. The "Reclaim_on" is equivalent to an "idle" command that tells the memory that the host will not send additional commands for some time. In some systems these may be the same command. The resulting reclaim_on mode ends whenever another host command is received.

A "Reclaim_normal" command allows the memory to operate in a default reclaim mode. This may mean reclaiming according to an adaptive schedule or may mean giving control of reclaim mode selection to the memory controller that then chooses the reclaim mode based on some predetermined criteria. The memory may default to this mode when a host command is received that causes a reclaim-on mode to terminate.

A "Reclaim_off" command causes reclaim operations to be inhibited and only host operations to be performed. This mode may be chosen to provide maximum host data write performance. This mode is terminated by either reclaim_on or reclaim_normal commands.

A hierarchy of possible reclaim modes in descending order of reclaim rate is:

Reclaim_on: The device performs continuous reclaim operations until another command is received.

Maximum interleave: Reclaim operations are interleaved with host data write operations, at a fixed maximum interleave ratio. This is an upper limit for the adaptive interleave ratio.

Adaptive interleave: Reclaim operations are interleaved with host data write operations according to an adaptive interleave ratio.

Minimum interleave: Reclaim operations are interleaved with host data write operations, at a fixed minimum interleave ratio. This is a lower limit for the adaptive interleave ratio.

Reclaim_off: Reclaim operations are inhibited, and only host data write operations are performed.

It should be noted that the above description refers to writing host data at a constant rate. The constant rate provided by interleaved reclaiming is observed over multiple cycles. When observed at the level of individual cycles, the writing of host data takes place in periodic bursts of host write operations interspersed with bursts of reclaim operations. However, the rate of host data writing per cycle or over a number of cycles may remain constant at a rate that is estimated so that it can be maintained until the memory array is full.

In the above description, the rate at which reclaimable space is converted to erased blocks in the memory array is shown to be constant. However, even though the number of reclaim operations per cycle, or per unit of time, may be constant, the rate at which erased blocks are produced by reclaim operations may not be constant. This is because blocks to be reclaimed may be selected so that blocks that are easier to reclaim are reclaimed first. Thus, when adaptive reclaim begins, a block may be reclaimed for every R pages of data that are copied because the blocks being reclaimed have R pages of valid data. Later, blocks may be reclaimed that have 2R pages of valid data so that it takes 2R copy operations for every erased block produced. Thus, the rate at which erased blocks are produced by reclaim is reduced to half the earlier rate. In other examples, the rate at which erased blocks are produced may vary in other ways according to the order in which blocks are reclaimed. If blocks are reclaimed without regard to the amount of valid data contained in them, the rate at which erased blocks are produced by reclaim will be fairly constant.

Although the various aspects of the present invention have been described with respect to exemplary embodiments thereof, it will be understood that the present invention is entitled to protection within the full scope of the appended claims.

The invention claimed is:

1. A memory system, comprising:
a non-volatile memory array that includes a plurality of blocks, a block being the minimum unit of erase;
a memory controller operable to maintain a record of logical-to-physical mapping for host data stored in the non-volatile memory array, the record having a plurality of entries, an individual entry indicating a logical address by a unique file identifier and an offset, the memory controller further operable to determine whether stored data is valid or obsolete according to information supplied by a host, the memory controller further operable to copy valid data at a rate that depends on the amount of data to be copied to reclaim remaining reclaimable space and on the total amount of additional host data that may be written before the memory array becomes full.

2. The memory system of claim 1 wherein the memory controller is further operable to calculate the rate in response to a host command.

3. The memory system of claim 1 wherein the memory controller is further operable to calculate the rate to provide a constant rate of programming of host data until the memory is filled with valid host data.

4. The memory system of claim 1 wherein the memory system is embodied in a removable memory card that is operable to communicate with the host through a standard interface.

5. The memory system of claim 1 wherein the information supplied by the host includes information regarding host files using unique file identifiers to refer to host files.

6. The memory system of claim 1 wherein the memory controller is further operable to determine the rate by an interactive ratio.

7. The memory system of claim 6 wherein the interactive ration is the ration of (a) programming of host data received from a host to the non-volatile memory to (b) copying of previously stored valid data from one block to another.

* * * * *

UNITED STATES PATENT AND TRADEMARK OFFICE
CERTIFICATE OF CORRECTION

| | | |
|---|---|---|
| PATENT NO. | : 7,984,084 B2 | Page 1 of 1 |
| APPLICATION NO. | : 11/259439 | |
| DATED | : July 19, 2011 | |
| INVENTOR(S) | : Alan Welsh Sinclair | |

It is certified that error appears in the above-identified patent and that said Letters Patent is hereby corrected as shown below:

CLAIMS:
In line 2 of claim 7 (column 24, line 38) "ration is the ration of" should read --ratio is the ratio of--.

Signed and Sealed this
Fourth Day of October, 2011

David J. Kappos
*Director of the United States Patent and Trademark Office*